US012713662B2

(12) United States Patent
Das et al.

(10) Patent No.: US 12,713,662 B2
(45) Date of Patent: Aug. 18, 2026

(54) ULTRA-STEEP SLOPE AND HIGH-PERFORMANCE STRAIN EFFECT TRANSISTOR

(71) Applicant: The Penn State Research Foundation, University Park, PA (US)

(72) Inventors: Saptarshi Das, State College, PA (US); Sarbashis Das, State College, PA (US)

(73) Assignee: The Penn State Research Foundation, University Park, PA (US)

(*) Notice: Subject to any disclaimer, the term of this patent is extended or adjusted under 35 U.S.C. 154(b) by 143 days.

(21) Appl. No.: 18/861,954

(22) PCT Filed: Jun. 21, 2023

(86) PCT No.: PCT/US2023/025843
§ 371 (c)(1),
(2) Date: Oct. 31, 2024

(87) PCT Pub. No.: WO2024/063826
PCT Pub. Date: Mar. 28, 2024

(65) Prior Publication Data

US 2025/0126851 A1 Apr. 17, 2025

Related U.S. Application Data

(60) Provisional application No. 63/367,676, filed on Jul. 5, 2022.

(51) Int. Cl.
*H10D 48/50* (2025.01)

(52) U.S. Cl.
CPC .................................. *H10D 48/50* (2025.01)

(58) Field of Classification Search
CPC .. H10D 30/798; H10D 30/794; H10D 30/791; H10D 62/121
See application file for complete search history.

(56) References Cited

U.S. PATENT DOCUMENTS

2011/0248322 A1 10/2011 Wong et al.
2013/0029880 A1 1/2013 Cregg et al.
(Continued)

FOREIGN PATENT DOCUMENTS

CN 114023817 A * 2/2022

OTHER PUBLICATIONS

International Search Report for PCT/US2023/025843 dated Apr. 29, 2024.

(Continued)

*Primary Examiner* — Raj R Gupta
(74) *Attorney, Agent, or Firm* — Buchanan Ingersoll & Rooney PC

(57) ABSTRACT

Embodiments relate to a transistor having a substrate and a gate formed in or on a surface of the substrate. The gate can include a piezoelectric material. The transistor has a drain and a source formed in or on a surface of the gate. The transistor has a channel formed adjacent to the gate and located between the drain and the source. The channel can include a semiconductor/semi-metallic material. The transistor can have a source contact formed at the source and configured to anchor the semiconductor/semi-metallic channel material to the piezoelectric material. The transistor can have a drain contact formed at the drain and configured to anchor the semiconductor/semi-metallic channel material to the piezoelectric material. The transistor operates on the principle of voltage induced strain transduction via a piezoelectric gate stack leading to a modification of the interface between the metal contact and the semiconducting/semi-metallic channel material.

14 Claims, 21 Drawing Sheets

(56) References Cited

U.S. PATENT DOCUMENTS

2013/0299880 A1* 11/2013 Du .......................... H10N 50/10
438/3
2018/0374962 A1* 12/2018 Das .......................... H01L 29/24

OTHER PUBLICATIONS

Written Opinion of the International Searching Authority for PCT/US2023/025843 dated Apr. 29, 2024.
Feng Li, et al., "Recent Advances in Strain-Induced Piezoelectric and Piezoresistive Effect-Engineered 2D Semiconductors for Adaptive Electronics and Optoelectronics" Nano-Micro Letters, (2020) 12:106, https://doi.org/10.1007/s40820-020-00439-9.
Sarbashis Das and Saptarshi Das, "An Ultra-steep Slope Two-dimensional Strain Effect Transistor" Nano Letters 2022, 22, 9252-9259, https://doi.org/10.1021/acs.nanolett.2c02194.
Wenhui Hou, et al., "Strain-based room-temperature non-volatile MoTe2 ferroelectric phase change transistor" Nature Nanotechnology | vol. 14 | Jul. 2019 | 668-673 | www.nature.com/naturenanotechnology.

* cited by examiner

100

ULTRA-STEEP SLOPE AND HIGH-PERFORMANCE STRAIN EFFECT TRANSISTOR

CROSS-REFERENCE TO RELATED APPLICATIONS

This patent application is a U.S. national stage application under 35 U.S.C. § 371 for International Patent Application No. PCT/US2023/025843, filed on Jun. 21, 2023, which is related to and claims the benefit of priority of U.S. provisional patent application No. 63/367,676 filed on Jul. 5, 2022, the entire contents of each is incorporated herein by reference.

STATEMENT CONCERNING FEDERALLY SPONSORED RESEARCH OR DEVELOPMENT

This invention was made with government support under Grant No. W911NF-19-1-0488 awarded by the United States Army/ARO. The Government has certain rights in the invention.

FIELD OF THE INVENTION

Embodiments relate to a transistor having a gate made of piezoelectric material, a channel made of semiconducting/semi-metallic material, a source contact configured to anchor the semiconducting/semi-metallic material to the piezoelectric material, and a drain contact configured to anchor the semiconducting/semi-metallic material to the piezoelectric material. The transistor operates on the principle of voltage induced strain transduction via a piezoelectric gate stack leading to a modification at the channel/contact interface.

BACKGROUND OF THE INVENTION

For more than eight decades, the semiconductor industry has witnessed relentless growth across all sectors of modern societies driven by the advancements in silicon based complementary metal oxide semiconductor (CMOS) technology, which, in turn, has been aided by material discoveries, improvements in device structures, optimizations at the circuit and architectural levels, and progress in micro- and nanolithography techniques. Aggressive channel length scaling of metal oxide semiconductor field effect transistors (MOSFETs) allowing more devices to be assembled per unit area while keeping the power density almost constant has been the driving philosophy behind the CMOS technology in the Dennard era leading to orders of magnitude improvements in the computing capabilities of modem processors. Unfortunately, the golden era of MOSFET scaling has now ended since both energy and dimension scaling appear to be fundamentally challenged.

The stagnation in energy scaling is a direct consequence of non-scalability of the subthreshold swing (SS), which is defined as the gate voltage ($V_{GS}$) required to increase the source-to-drain current ($I_{DS}$) of a MOSFET by one order of magnitude, to below 60 mV/decade at room temperature, also known as the Boltzmann tyranny. This leads to an exponential increase in the OFF-state current ($I_{OFF}$) when scaling the threshold voltage ($V_T$) of the MOSFET, $I_{OFF}=10^{-V_T/SS}$. To mitigate this challenge, transistor devices and structures have been proposed. Tunnel field effect transistor (TFET), which exploits electrostatic control of band-to-band tunneling to achieve steep slope switching is the forerunner in this context. Ever since the first TFET based on carbon nanotube (CNT) achieved a SS=40 mV/decade, the field has grown to include Si TFETs, III-V material-based TFETs, $MoS_2$—Ge TFET, and black phosphorous TFETs among others. While extensive research in this field has produced some very impressive results like SS=3.9 mV/decade and ON-current value of ~15 μA/μm, only a countable number of studies (<25) report sub-60 mV/decade SS and almost all studies observe steep slope only for 1-2 orders of magnitude change in $I_{DS}$. While the concept of TFET is fundamentally sound, limited experimental success has stymied the progress in this field in recent years.

Negative capacitance field effect transistors (NCFETs), which exploit ferroelectric gate-stack to achieve steep slope switching offer another alternative for low-power circuits where SS<20 mV/decade have been reported experimentally. NCFETs triumph over TFETs in their ability to achieve high ON-current. In addition, this field has recently gained momentum owing to the development of doped hafnium oxide ($HfO_2$) based ferroelectrics, which can be aggressively scaled and integrated with silicon. However, material and interface non-idealities including defects, charge trapping etc. can severely limit $HfO_2$-based NCFETs from achieving steep slope switching. Moreover the community still appears to be divided over the fundamental concept of negative capacitance with both sides having valid arguments.

Phase change materials (PCMs) show abrupt phase transition from metal-to-insulator phase. They form another major class of devices where steep slope switching has been explored. However, since they are 2-terminal devices, they cannot be gate modulated. Devices like the phase change TFET use a PCM in series with a TFET to mitigate the aforementioned challenge but fail to achieve high ON/OFF current ratio.

While, TFET, NCFET, PCM are promising steep slope devices, they still present nonzero $I_{OFF}$. Nano electromechanical switches (NEMS) can mitigate this challenge as these are contact-based switches comprising of a mobile structure that is deflected using electrostatic forces until it reaches physical contact with an electrode, forming a path that allows current to flow. The no-contact OFF state of NEMS ensures near zero $I_{OFF}$ and at the same time the switching can be infinitely abrupt. In fact, SS as low as 0.285 mV/decade has been achieved using CMOS/NEMS hybrid designs. Finally, while steep slope and low-$I_{OFF}$ are critical needs for future low-power devices transconductance ($g_m$) is an equally important metric that determines whether a switch can offer signal amplification. Unfortunately, NEMS devices cannot be used for this purpose. Nevertheless, the above discussion summarizes the basic technology requirements for a low-power and high-performance switch, which include steep slope switching (SS<60 mV/decade), large current ON/OFF ratio, low OFF-state current, high ON-state current, and high transconductance.

BRIEF SUMMARY OF THE INVENTION

Embodiments relate to a transistor having a substrate and a gate formed in or on a surface of the substrate. The gate can include a piezoelectric material. The transistor has a drain and a source, each of the drain and the source formed in or on a surface of the gate. The transistor has a channel formed in or on a surface of the gate, the channel located between the drain and the source. In some embodiments, the channel can be adjacent the surface of the gate. The channel can include a semiconducting/semi-metallic material. The transistor can have a source contact formed at the source and configured to anchor the semiconducting/semi-metallic material to the piezoelectric material. The transistor can have a drain contact formed at the drain and configured to anchor the semiconducting/semi-metallic material to the piezoelectric material.

The transistor operates via gate-voltage induced strain transduction in the piezoelectric material leading to an abrupt and reversible modification at the interface between the channel and the contacts to achieve the abrupt switching. More particularly, the voltage induced strain transduction via a piezoelectric gate stack provides reversible cracking or delamination of contacts at the contact/channel interface (or the metal/2D van der Waals interface). As will be explained in more detail, when no gate voltage ($V_{GS}$) is applied to the PZT, the transistor is in an ON-state since a large current flows between the source and the drain terminal owing to the semi-metallic nature of the channel material (e.g., 1T'-$MoTe_2$). With any finite $V_{GS}$>0 V, the PZT is subjected to an out-of-plane electric field resulting in an out-of-plane strain, which is translated as in-plane strain on the 1T'-$MoTe_2$ channel and the metal (e.g., Ni) contacts since the volume of PZT must remain constant. Since the channel material is anchored to the PZT substrate by a high tensile strength contact metal, efficient strain transduction on channel material occurs in the area of overlap between the source/drain contact regions. As $V_{GS}$ increases, the strain also increases and finally, when $V_{GS}$ exceeds a critical value, $V_S$, the strain crosses the threshold where the contact physically delaminates from the channel and abruptly breaks the electrical path between the contact and the channel leading to steep slope switching from the ON to the OFF state. Contact modification at the interface between the channel and the metal is sufficient to "turn off" the current flow through the device. Removal of the electric field across the piezoelectric material leads to the reverse process where the channel relaxes back to the original state and regains its initial physical and electrical properties.

Embodiments can relate to a transistor. The transistor can include a substrate. The transistor can include a gate formed in or on a surface of the substrate, the gate comprising a piezoelectric material. The transistor can include a drain and a source, each of the drain and the source formed in or on a surface of the gate. The transistor can include a channel formed in or on a surface of the gate, the channel located between the drain and the source, the channel comprising a semiconducting/semi-metallic material. The transistor can include a source contact formed at the source and configured to anchor the semiconducting/semi-metallic material to the piezoelectric material. The transistor can include a drain contact formed at the drain and configured to anchor the semiconducting/semi-metallic material to the piezoelectric material. Strain induced transduction in the gate can cause contact modification between the channel and at least one of the source contact and the drain contact.

In some embodiments, an out-of-plane direction can be defined by a vertical direction through the substrate, the gate, and the channel. An in-plane direction can be defined as a horizontal direction perpendicular to the out-of-plane direction. An electric field applied to the gate can generate an out-of-plane strain on the piezoelectric material which causes the contact modification.

In some embodiments, the contact modification can involve cracking/delamination at the interface between the channel and the source contact material and/or the drain contact material or a conductor to insulator phase transition at the interface between the channel and the source contact material and/or the drain contact material.

In some embodiments, the substrate forms a gate and the gate can be connected to a gate-to-source voltage ($V_{GS}$), the drain can be connected to a drain-to-source voltage ($V_{DS}$), the source can be connected to ground, and $V_{GS}$>0 can apply an electric field to the gate.

In some embodiments, an electric field greater than a threshold value can be required to generate contact modification.

In some embodiments, $V_{GS}$ greater than or equal to a threshold value ($V_{GS}$> or =$V_S$) can generate the electric field greater than the threshold value to cause the contact modification.

In some embodiments, when $V_{GS}$<$V_S$, the transistor can be in an ON state. In some embodiments, when $V_{GS}$> or = $V_S$, the transistor can be in an OFF state.

In some embodiments, the substrate can be a conducting material or a degenerately doped semiconducting material.

In some embodiments, the piezoelectric material can be lead zirconate titanate (PZT).

In some embodiments, the piezoelectric material can have a thickness of 2 micrometers (μm).

In some embodiments, the channel material can be a voltage induced strain transduction material.

In some embodiments, the channel material can be a semiconducting/semi-metallic material.

In some embodiments, the transistor can exhibit contact modification at room temperature.

In some embodiments, the conductor-insulator phase transitioning material can be 1T' $MoTe_2$ or graphene.

In some embodiments, the anchoring can occur via mechanical and/or chemical adhesion between the semiconducting/semi-metallic material and the piezoelectric material.

In some embodiments, the transistor can include a source contact region comprising a transistor layer stack in which the source contact is vertically aligned with the source, the channel, and the gate, wherein the source contact contributes to anchoring the semiconducting/semi-metallic material to the piezoelectric material. The transistor can include a drain contact region comprising a transistor layer stack in which the drain contact is vertically aligned with the drain, the channel, and the gate, wherein the drain contact contributes to anchoring the semiconducting/semi-metallic material to the piezoelectric material.

In some embodiments, the source contact and/or the drain contact can comprise material exhibiting high tensile strength.

In some embodiments, strain transduction can be limited to the channel material within the source contact region due to the anchoring provided by the source contact and the high tensile strength of the source contact material. Strain transduction can be limited to the channel material within the drain contact region due to the anchoring provided by the drain contact and the high tensile strength of the drain contact material.

Further features, aspects, objects, advantages, and possible applications of the present invention will become apparent from a study of the exemplary embodiments and examples described below, in combination with the Figures, and the appended claims.

BRIEF DESCRIPTION OF THE FIGURES

The above and other objects, aspects, features, advantages, and possible applications of the present invention will be more apparent from the following more particular description thereof, presented in conjunction with the following drawings. It should be understood that like reference numbers used in the drawings may identify like components.

DETAILED DESCRIPTION OF THE INVENTION

The following description is of an embodiment presently contemplated for carrying out the present invention. This description is not to be taken in a limiting sense but is made merely for the purpose of describing the general principles and features of the present invention. The scope of the present invention should be determined with reference to the claims.

Figure 1:
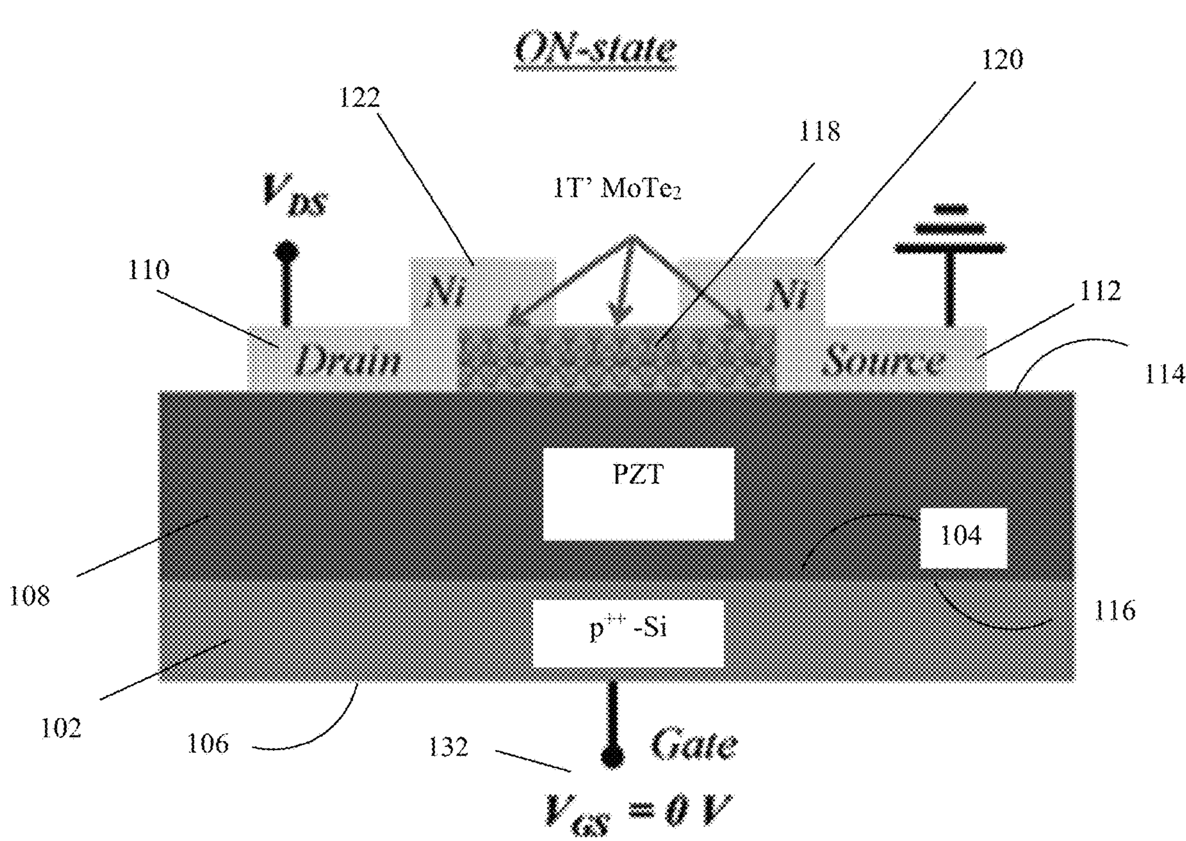
FIG. 1 shows a schematic representation of operation of an embodiment of the transistor in the ON-state.
Figure 2:
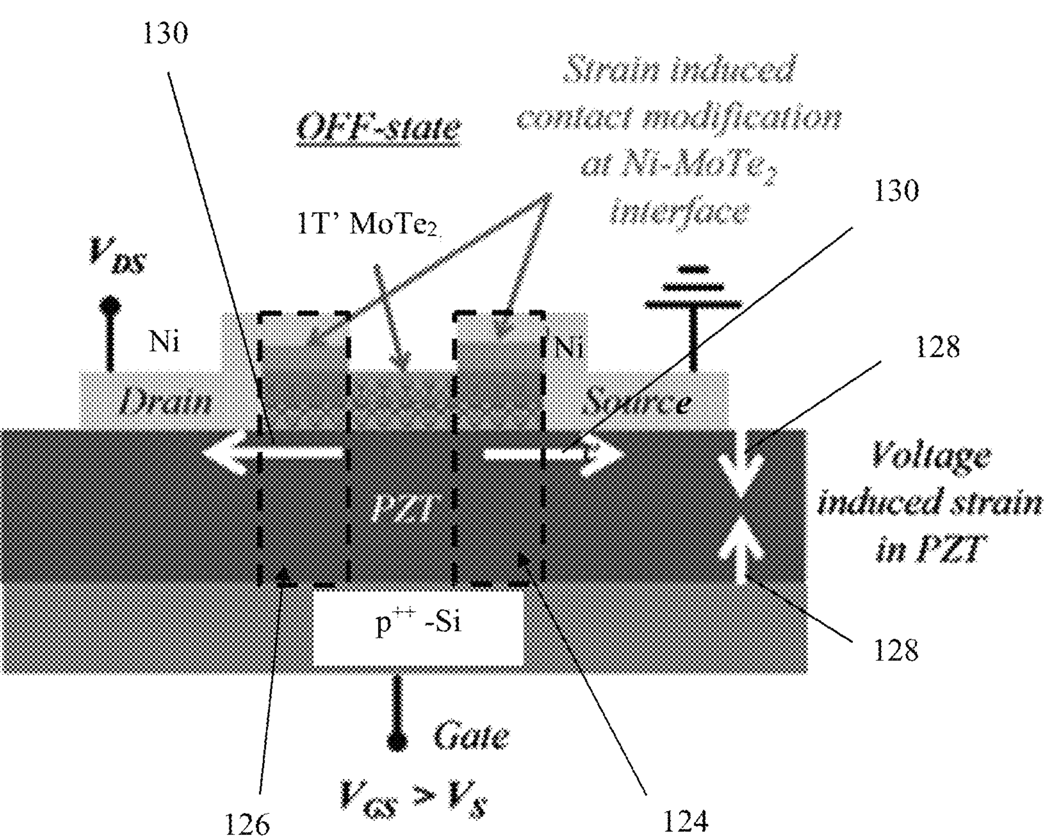
FIG. 2 shows a schematic representation of operation of an embodiment of the transistor in the OFF-state.

Referring to FIGS. 1-2, embodiments relate to a transistor 100. The transistor 100 can be configured as a strain effect transistor (SET). A SET is a transistor that can change conductance based on strain imposed on a portion of the transistor. The strain can be imposed via an electric field applied to the transistor. For instance, a SET can switch to and from an ON state (conductive state) and an OFF state (non-conductive state) based on an electric field applied to it.

The transistor 100 can include a substrate 102. The substrate 102 can be a conducting material or a degenerately doped semi-conducting material.

The transistor 100 can include a gate 108 formed in or on a surface of the substrate 102. For instance, the substrate 102 can be a structure having a substrate top surface 104 and a substrate bottom surface 106. The gate 108 can be formed in or on a top surface 104 of the substrate 102. It is contemplated for the gate 108 to include a piezoelectric material. In some embodiments, the gate 108 is entirely made of a piezoelectric material. The piezoelectric material can be lead zirconate titanate (PZT), lead magnesium niobate-lead titanate (PMN-PT), polyvinylidene fluoride (PVDF), hafnium zirconium oxide (HZO), etc. The gate 108 can be a thin film of piezoelectric material formed on the substrate top surface 104. It should be noted that the thinner the piezoelectric material layer, the lower the voltages (e.g., <1V) can be to operate the transistor 100. Thus, it may be desirable to reduce the thickness of the piezoelectric material layer as much as possible so as to generate a transistor 100 that can be operated at lower voltages. Some embodiments of the transistor 100 include a piezoelectric material layer with a thickness of 2 μm.

The transistor 100 can include a drain 110 and a source 112. Each of the drain 110 and the source 112 can be formed in or on a surface of the gate 108. For instance, the gate 108 can be a structure having a gate top surface 114 and a gate bottom surface 116. The gate bottom surface 116 can be adjacent the substrate top surface 104, and both of the source 112 and the drain 110 can be formed in or on the gate surface 114.

The transistor 100 can include a channel 118 formed in or on a surface of the gate 108. For instance, the channel 118 can be formed in or on the gate top surface 114. In some embodiments, the channel 118 can be formed adjacent a surface of the gate 108. The channel 118 can be located between the drain 110 and the source 112. Thus, the gate top surface 114 can have the drain 110, the source 112, and the channel 118 formed in or on it, wherein the channel 118 is located between the drain 110 and the source 112. It is contemplated for the channel 118 to include a semiconducting/semi-metallic material. In some embodiments, the channel 118 is entirely made of a semiconducting/semi-metallic material. The semiconducting/semi-metallic material can be a voltage induced strain transduction material. It is contemplated for the semiconducting/semi-metallic material to exhibit voltage induced strain transduction at room temperature. In some embodiments, the semiconducting/semi-metallic material can be a metal-insulator phase transitioning material. An exemplary conductor-insulator phase transitioning material can be 1T' $MoTe_2$, $WTe_2$, $MoS_2$, $WSe_2$, graphene, etc.

The transistor 100 can include a source contact 120 formed at or near the source 112. The source contact 120 can be configured to anchor (or at least improve or enhance the anchoring) the semiconducting/semi-metallic material to the piezoelectric material. The transistor 100 can include a drain contact 122 formed at or near the drain 110. The drain contact 122 can be configured to anchor (or at least improve or enhance the anchoring) the semiconducting/semi-metallic material to the piezoelectric material. The anchoring occurs via mechanical and/or chemical adhesion between the semiconducting/semi-metallic material and the piezoelectric material. For instance, the transistor 100 can include a source contact region 124 comprising a transistor 100 layer stack in which the source contact 120 is vertically aligned with the source 112, the channel 118, and the gate 108, wherein the source contact 120 contributes to anchoring the semiconducting/semi-metallic material to the piezoelectric material. The transistor 100 can include a drain contact region 126 comprising a transistor 100 layer stack in which the drain contact 122 is vertically aligned with the drain 110, the channel 118, and the gate 108, wherein the drain contact 122 contributes to anchoring the semiconducting/semi-metallic material to the piezoelectric material.

The transistor 100 can be fabricated as a planar structure having layers of materials, forming a layer stack. For instance, the layer stack can include a portion of the substrate 102, a portion of the gate 108, a portion of the channel 118, a portion of the drain 110, a portion of the drain contact 122, etc. As another example, the layer stack can include a portion of the substrate 102, a portion of the gate 108, a portion of the channel 118, a portion of the source 112, a portion of the source contact 120, etc. A vertical direction can be defined as a direction that is transverse through the layers. A horizontal direction can be defined as a direction perpendicular to the vertical direction. With such a structural configuration, the transistor 100 can have an out-of-plane direction 128 that is defined by the vertical direction. For instance, the out-of-plane direction 128 can be a vertical direction through the substrate 102, the gate 108, and the channel 118. The transistor 100 can have an in-plane direction 130 that is defined by the horizontal direction.

With a layered structure, the transistor 100 can include the substrate 102 as the first layer. The second layer can be the gate 108. The second layer can be formed in or on the entire substrate top surface 104, a portion thereof, or multiple portions thereof. The drain 110, the source 112, and the channel 118 can all form a third layer. The drain contact 122 and the source contact 120 can form a fourth layer.

With the layered structural configuration of the transistor 100, the gate 108 being made of piezoelectric material, and the channel 118 being made of semiconducting/semi-metallic material, strain can be transduced by applying an electric field across the gate 108 which causes the interface between the channel and the contacts to undergo a modification.

The source contact 120 and/or the drain contact 122 can include material exhibiting high tensile strength. For instance, the source contact 120 material and/or the drain contact 122 material can include or be made of nickel, iron, tungsten, titanium, etc. With such a configuration, strain transduction can be limited to the channel 118 material within the source contact region 124 due to the anchoring provided by the source contact 120 and the tensile strength of the source contact 120 material. Similarly, strain transduction can be limited to the channel 118 material within the drain contact region 126 due to the anchoring provided by the drain contact 122 and the tensile strength of the drain contact material.

During an application of an electric field in the out-of-plane 128 direction, the thickness of the gate 108 material changes. Since the volume of the gate 108 material has to remain constant, there is a corresponding change in the lateral dimensions in the in-plane 130 strain direction. Because the source contact 120 and the drain contact 122 anchor the channel 118 material to the gate 108 material via a high tensile strength material, efficient strain transduction on the channel 118 material occurs. Furthermore, transduction of the channel 118 material just within the source/drain contact regions 124, 126 is all that is required to change the ON/OFF state of the transistor 100.

The transistor 100 can be configured such that the substrate 102 forms a gate 132. The gate 132 can be connected to a gate-to-source voltage ($V_{GS}$). The drain 110 can be connected to a drain-to-source voltage ($V_{DS}$). The source 112 can be connected to ground. When $V_{GS}>0$, an electric field is applied to the gate 108.

The transistor 100 can be configured such that an electric field is used to generate the out-of-plane 128 strain on the piezoelectric material that leads to the in-plane strain 130 on the semiconducting/semi-metallic material of the channel 118 that causes the semiconducting/semi-metallic material to undergo a modification at the interface between the channel and the contacts. The electric field needs to be greater than a threshold value to achieve this modification. For instance, the transistor 100 can be configured such that $V_{GS}$ greater than or equal to a threshold value ($V_{GS}$> or $=V_S$) generates the electric field greater than the threshold value to cause the semiconducting/semi-metallic material to undergo the modification. $V_S$ can be within a range from 10-50 V. In some embodiments, $V_S$ can be <10V. Thus, when $V_{GS}<V_S$, the conductor-semiconducting/semi-metallic material is in a conducting state and the transistor 100 is in an ON state. When $V_{GS}$> or $=V_S$, the semiconducting/semi-metallic material is in an insulating state and the transistor 100 is in an OFF state.

Embodiments of the transistor 100 provide for a high-performance and ultra-steep slope switch, referred to as strain effect transistor (SET) with subthreshold swing of <0.68 mV/decade at room temperature for 7 orders of magnitude change in the source-to-drain current based on atomically thin 1T' $MoTe_2$ as the channel material, piezoelectric lead zirconate titanate (PZT) as the gate dielectric, and high-tensile strength nickel (Ni) as the source/drain contact 120, 122 metal. Embodiments of the transistor 100 exploit gate voltage induced strain transduction in PZT leading to abrupt and reversible modification at the interface between the channel 118 and the Ni contacts 120, 122 to achieve the abrupt switching. The transistor 100 not only overcomes the fundamental thermodynamic limitations imposed by Boltzmann statistics that restrict energy scaling in traditional metal oxide semiconductor field effect transistors, but also introduces an alternative channel 118 material capable of achieving high drive current and transconductance at aggressively scaled body thicknesses. The transistor 100 also exhibits low OFF-state current <1 pA/μm, high ON-state current >1.8 mA/μm at a supply voltage of 1 V, large current ON/OFF ratio $>10^9$, and high transconductance of >100 μS/μm. The switching delay for the transistor 100 is found to be <5 μs and no device failure is observed even after 1 million ($10^6$) switching cycles. Embodiments of the transistor 100 is at least partially enabled by strain engineering at the metal/semiconductor contact interface to overcome the fundamental thermodynamic limitations imposed by Boltzmann statistics that restrict energy scaling in traditional metal oxide semiconductor field effect transistors.

Embodiments provide for a novel switching device, referred to as two-dimensional (2D) strain effect transistor 100 or SET 100 that not only overcomes the non-scalability of SS imposed by thermodynamic limitations in MOSFETs and achieves low SS <0.68 mV/decade at room temperature for 7 orders of magnitude change in the $I_{DS}$, but also exhibits record high ON current of ~1.8 mA/μm at a supply voltage of 1 V, current ON/OFF ratio $>10^9$, low OFF current of 1 pA/μm, and record high transconductance of >100 μS/μm. The SET 100 operates on the principle of voltage induced strain transduction via a piezoelectric gate stack leading to modification of the channel/contact interface. The SET 100 can switch in faster than 5 μs and no catastrophic failure occurs even after 1 million ($10^6$) switching cycles. Earlier studies have shown that there could be at least two different mechanisms explaining the steep-slope switching. Electrically reversible nanoscale cracks can occur in an intermetallic thin film grown on a ferroelectric substrate driven by a small electric field. There could also be a strain-induced phase transition in the channel changing it from a semi-metallic to a semiconducting phase. Either of these two phenomena could be observed at the contact/channel interface.

Examples

The following discussion relates to an exemplary embodiment of the SET 100 that was fabricated and tested.

The exemplary embodiment uses molybdenum ditelluride ($MoTe_2$) in its orthorhombic (1T') crystal structure as the channel 118 material, which is a layered 2D semi-metal. The exemplary embodiment uses lead zirconate titanate (PZT) as the piezoelectric material for the gate 108 dielectric. The exemplary embodiment uses nickel (Ni) as a high tensile strength material for the source and drain contacts 120, 122.

FIGS. 1-2 explain the operation of the exemplary SET 100, schematically. FIG. 1 shows a schematic representation of operation of SET 100 in ON-state, and FIG. 2 shows a schematic representation of the SET 100 in an OFF-state. When no gate voltage ($V_{GS}$) is applied to the PZT, the SET 100 is in the ON-state since a large current flows between the source 112 and the drain 110 terminal owing to the semi-metallic nature of 1T'-$MoTe_2$. With any finite $V_{GS}>0$ V, the PZT is subject to an out-of-plane 128 electric field resulting in an out-of-plane 128 strain, which is translated as an in-plane 130 strain on the 1T'-$MoTe_2$ since the volume of the PZT must remain constant. Since the 1T'-$MoTe_2$ is anchored to the PZT substrate by a high tensile strength contact 120, 122 metal, Ni, efficient strain transduction on 1T'-$MoTe_2$ channel 118 occurs in the area of overlap between the source/drain contact regions 124, 126. As $V_{GS}$ increases, the strain also increases and finally, when $V_{GS}$ exceeds a critical value, $V_S$, the strain crosses the threshold where the interface between the Ni contact and the $MoTe_2$ channel 118 abruptly changes and breaks the electrical path between the contact 120, 122 and the channel 118 leading to steep slope switching from the ON to the OFF state. Contact modification at the interface between the channel 118 and the metal is sufficient to "turn off" the current flow through the device. Removal of the electric field across the PZT leads to the reverse process where the interface between the Ni and the $MoTe_2$ relaxes back to the original state and regains its initial physical and electrical state. Modifying the region just under the contacts 120, 122 is sufficient to "turn off" the current flow through the device 100. Removal of the electric field across the PZT leads to the reverse process where the $MoTe_2$/Ni interface relaxes back to the original state.

With the exemplary SET 100, a 2 μm film of PZT is grown on a $p^{++}$-Si substrate 102 using the sol-gel growth technique to serve as the gate 108. Commercially available ultrathin flakes of 1T'-$MoTe_2$ are exfoliated on top of the PZT layer. Source/drain contacts 120, 122 are subsequently patterned on the flakes using electron beam (e-beam) lithography followed by e-beam evaporation of 40/30 nm Ni/Au and finally lift-off. Details about the fabrication and characterization processes of this exemplary SET 100 are discussed later. Clearly, the device structure resembles that of a MOSFET, yet a radically different approach is used by the SET 100 to switch between the ON and the OFF state. When no gate voltage ($V_{GS}$) is applied to the PZT (see FIG. 1), the SET 100 is in the ON-state since a large $I_{DS}$ flows between the source 112 and the drain 110 terminal owing to the semi-metallic nature of 1T'-$MoTe_2$. With any finite $V_{GS}>0$ V, the PZT is subject to an out-of-plane 128 electric field resulting in an out-of-plane 128 strain, which is translated as an in-plane 130 strain on the channel 118 and the source/drain contacts 120, 122 since the volume of the PZT must remain constant. $MoTe_2$ has a van der Waals layered structure with the absence of dangling bonds, while Ni crystallizes in the form of a face-centered cubic structure. The dissimilarities between the $MoTe_2$ in the channel 118 and the Ni in the contacts 120, 122 make the interface between the contact regions 124, 126 and the channel 118 more prone to modification. As $V_{GS}$ increases, strain also increases and finally, when $V_{GS}$ exceeds a critical value, $V_S$, the strain crosses the threshold where the interface between the Ni contact and the $MoTe_2$ channel abruptly changes and breaks the electrical conduction path leading to steep slope switching from the ON to the OFF state (see FIG. 2). Note that, initially, the entire channel 118 is highly conductive. Changing the region just under the contacts 120, 122 is sufficient to "turn off" the current flow through the device 100. Removal of the electric field across the PZT leads to the reverse process where the $MoTe_2$/Ni interface relaxes back to the original state.

Unlike a conventional FET, the gate 132 terminal of the SET 100 does not induce a conducting channel between the source 112 and the drain 110 terminal. Therefore, this phenomenon is better characterized as a "strain effect" rather than a field effect. Hence this device is referred to as a SET 100. Also note that unlike MOSFETs, where the interface between the dielectric and the channel significantly influences the SS, the absence of the field effect eliminates such impact on SS in the SET 100.

Figure 3:
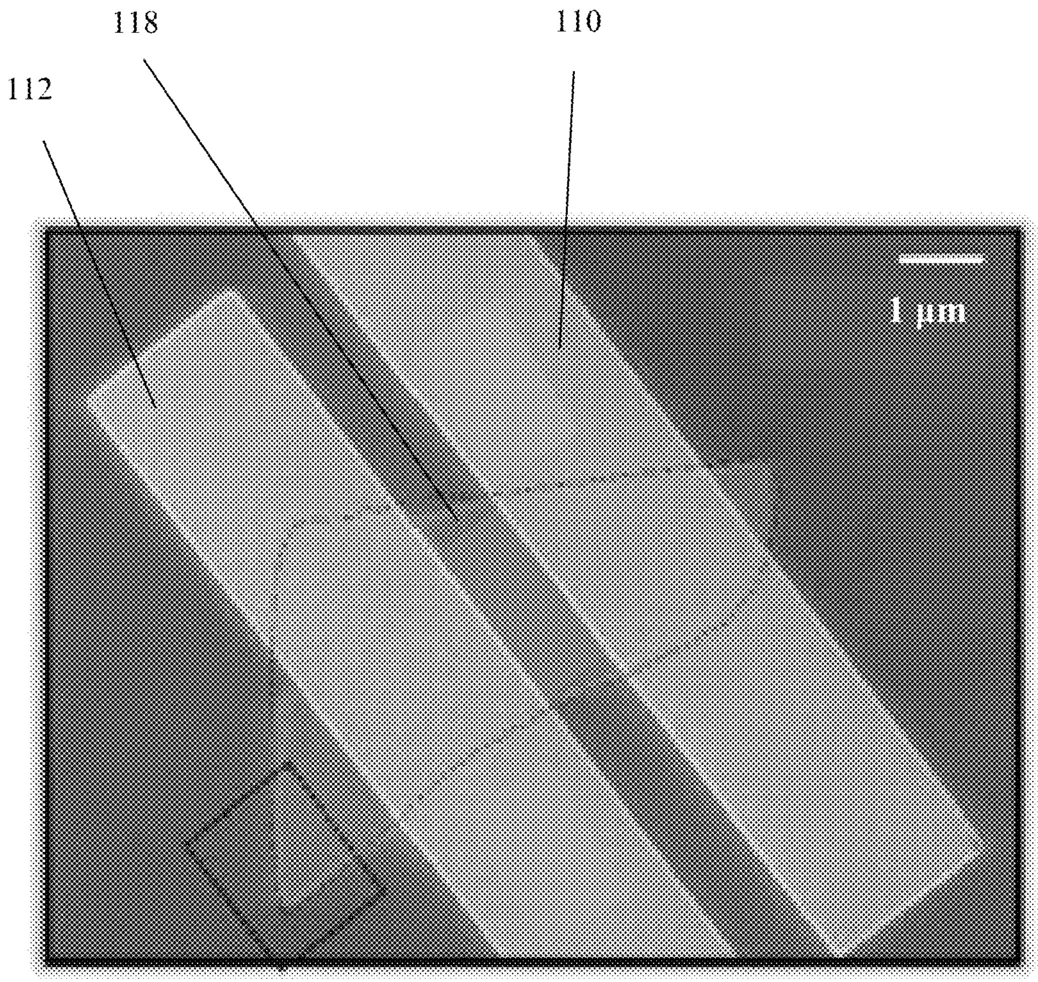
FIG. 3 shows a Scanning electron microscope (SEM) image of an embodiment of the transistor.
Figure 4:
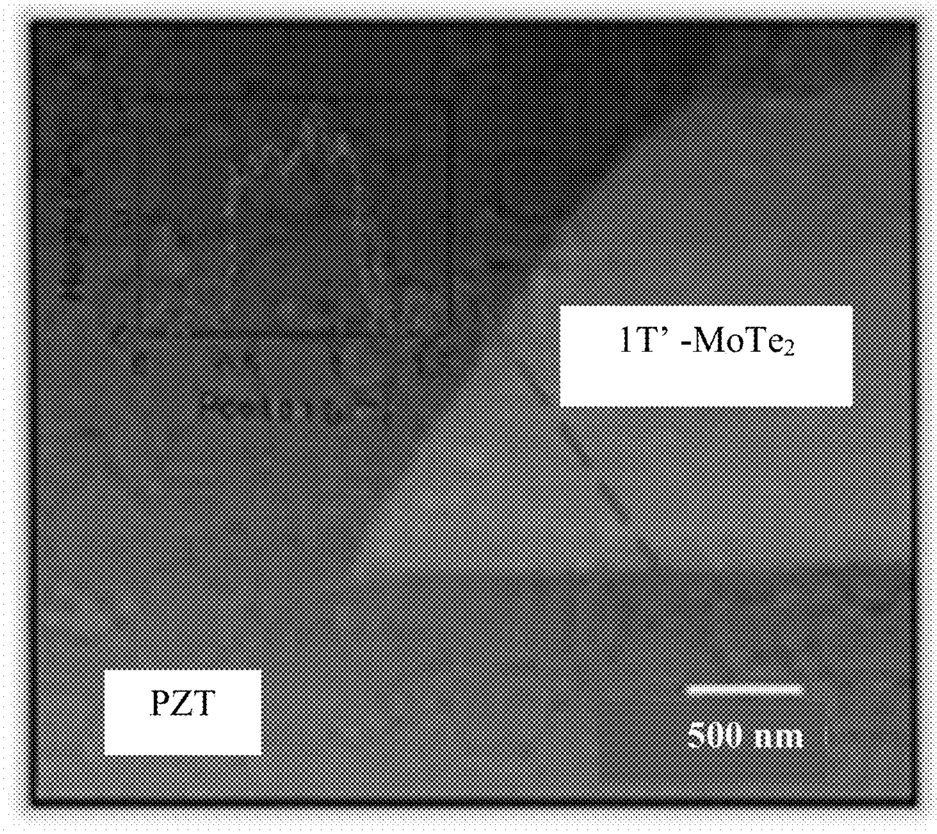
FIG. 4 shows an atomic force microscope (AFM) image and a height profile of $MoTe_2$ having 7.6 nm flake thickness.
Figure 5:
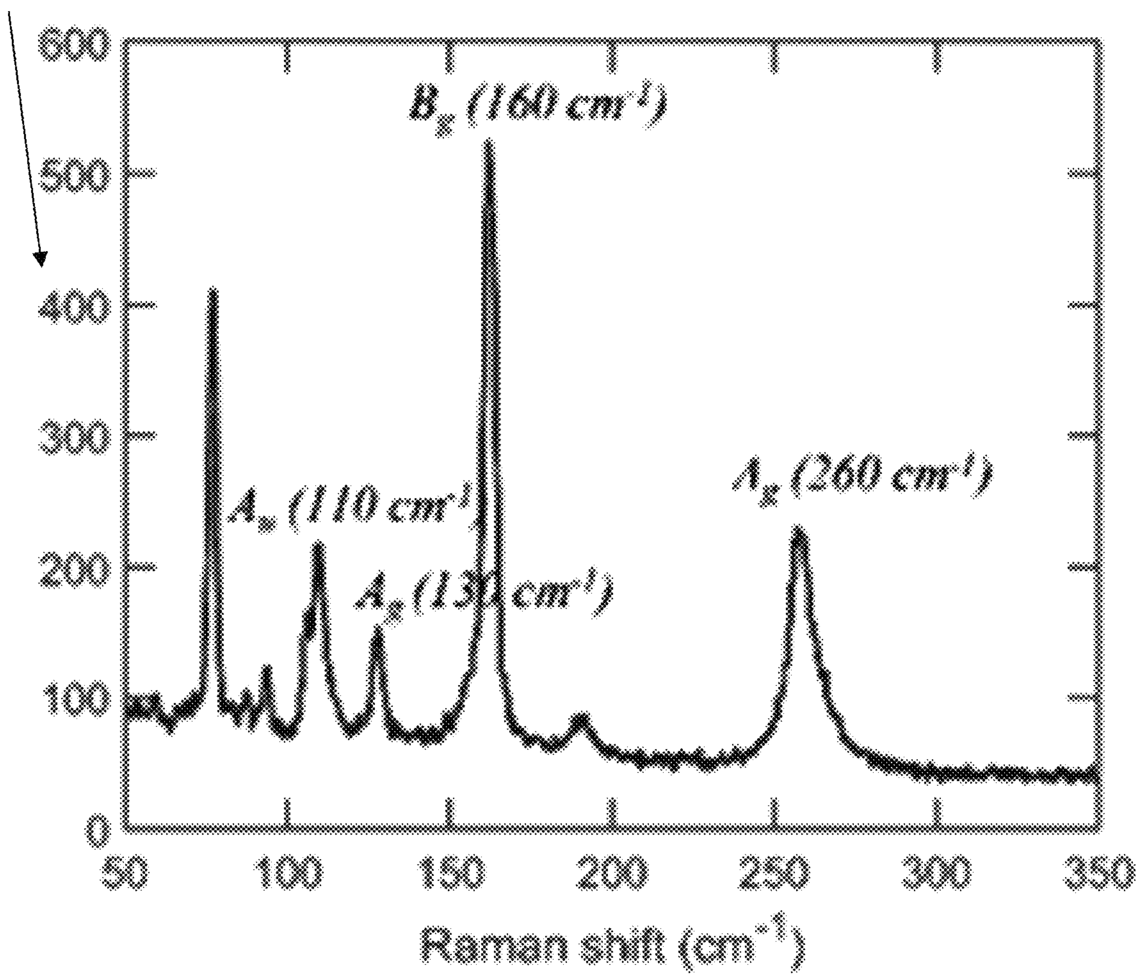
FIG. 5 shows Raman spectra of $MoTe_2$ flake with the prominent peak corresponding to the $B_g$ mode at 160 $cm^{-1}$, whereas the weaker $A_g$ mode has peaks at 130 $cm^{-1}$ and 260 $cm^{-1}$, and the $A_u$ mode has a peak at 110 $cm^{-1}$, confirming that the flake is in the 1T' phase with few layers.
Figure 6:
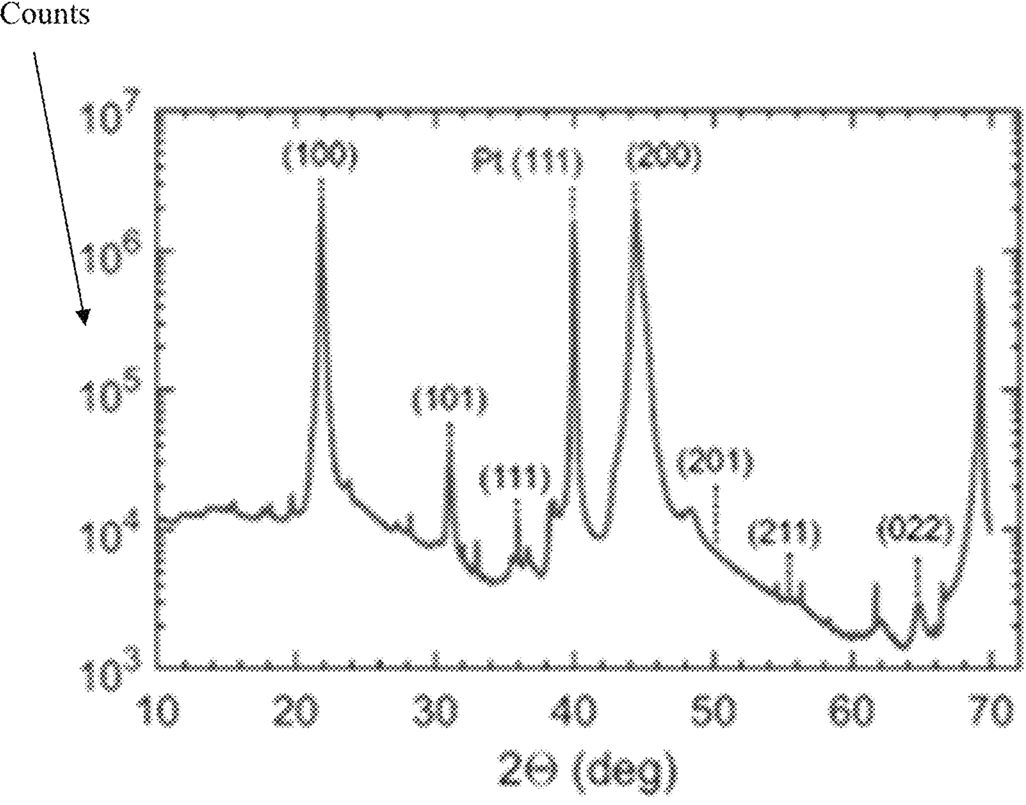
FIG. 6 shows X-ray diffraction (XRD) of PZT film indicating a strong (100) orientation with a Lotgering factor>98%.
Figure 7:
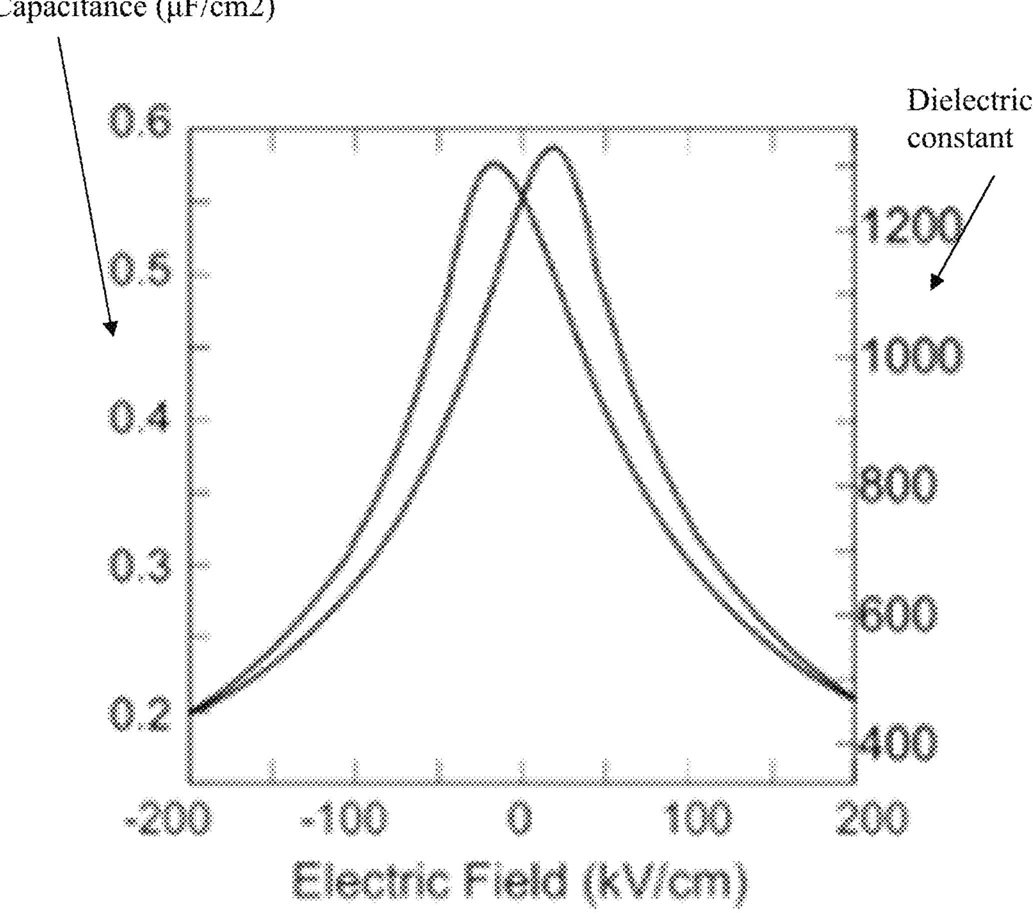
FIG. 7 shows capacitance versus electric field measurements for PZT film, which follows the characteristic butterfly shape with the relative dielectric constant reaching a maximum value of ~1350.
Figure 8:
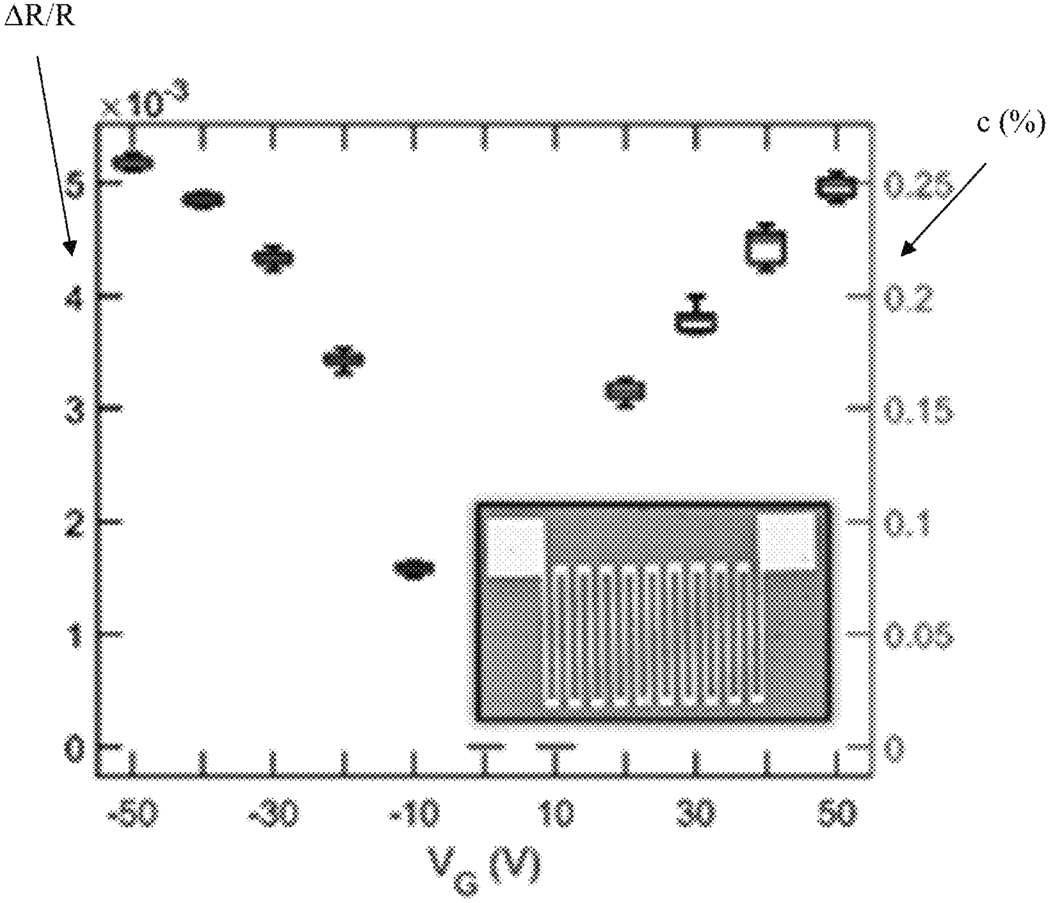
FIG. 8 shows fractional change in the resistance of a Ni-based strain gauge structure (shown in the inset) as a function of the voltage across the PZT film ($V_G$) used for calibrating the in-plane strain ($\epsilon$).
Figure 9:
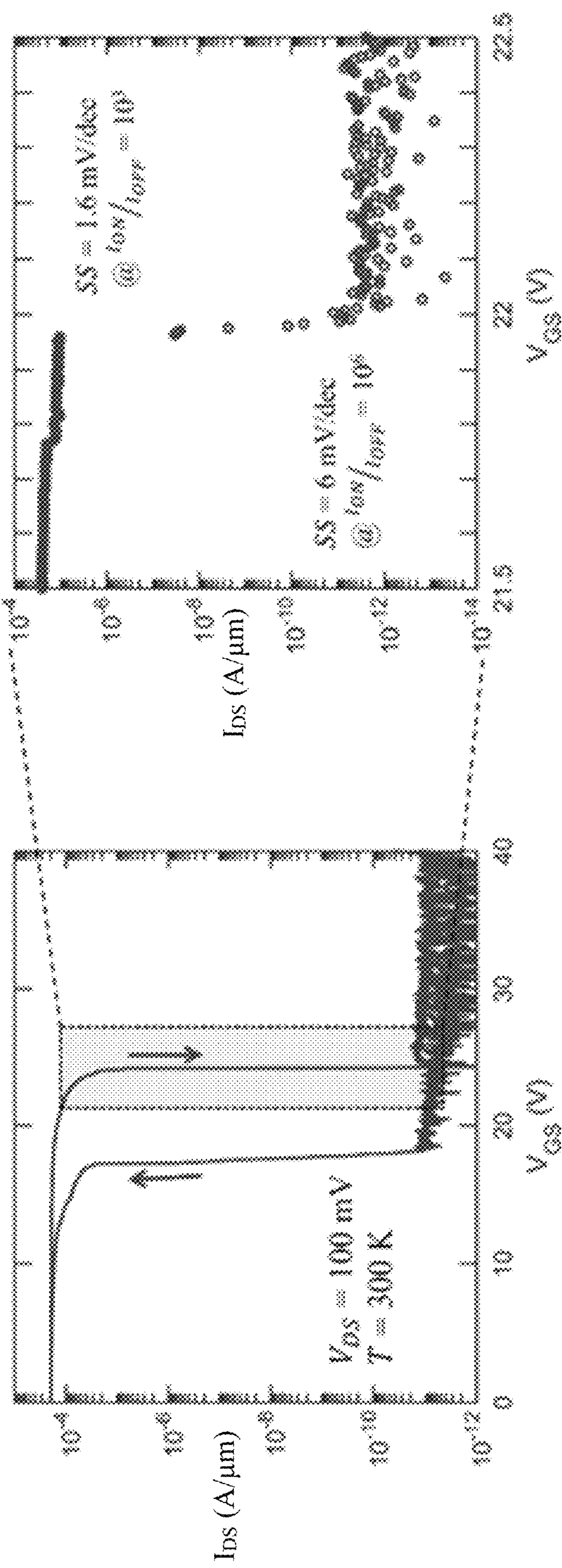
FIG. 9 shows room temperature transfer characteristics of an embodiment of the transistor (left) and a zoomed-in region where the device is turning off during the forward sweep (right).

FIG. 3 shows the scanning electron microscope (SEM) image of a representative SET 100, and FIG. 4 shows the atomic force microscope (AFM) image of the flake with height profile shown in the inset. The flake thickness is found to be ~7.6 nm. FIG. 5 shows the Raman spectra of the $MoTe_2$ flake with the prominent peak corresponding to the $B_g$ mode at 160 $cm^{-1}$, whereas the weaker $A_g$ mode has peaks at 130 $cm^{-1}$ and 260 $cm^{-1}$, and the $A_u$ mode has a peak at 110 $cm^{-1}$, confirming that the flake is in the 1T' phase with few layers. FIG. 6 shows X-ray diffraction (XRD) of the PZT film indicating a strong (100) orientation with a Lotgering factor >98%. FIG. 7 shows capacitance versus electric field measurements for the PZT film, which follows the characteristic butterfly shape with the relative dielectric constant reaching a maximum value of ~1350. FIG. 8 shows fractional change in the resistance ($^{\Delta R}/R$) of a Ni-based strain gauge structure (shown in the inset) as a function of the voltage across the PZT film ($V_G$) used for calibrating the in-plane strain ($\epsilon$). A gauge factor of 2 is used for Ni thin film. FIG. 9 shows the room temperature transfer characteristics, i.e. $I_{DS}$ versus $V_{GS}$ for $V_{DS}$=100 mV, in the logarithmic scale, for an exemplary SET 100 with 1 μm channel 118 length (L) and 1.5 μm channel width (W). Since the starting material is metallic, the SET 100 is in the ON-state at $V_{GS}$=0 V with ON current of ~0.2 mA/μm. When $V_{GS}$ is increased, the electric field across the PZT leads to an in-plane 130 strain at the Ni/$MoTe_2$ contact interface. Once $V_{GS}$ reaches $V_S$, the Ni contact to the $MoTe_2$ channel is modified and loses electrical contact which switches off the device with $I_{OFF}$~1 pA/μm. Note that $I_{OFF}$ is determined by the noise floor of the instrument. When $V_{GS}$ is swept back from 40 V to 0 V, the reverse process is triggered at a lower $V_S$ resulting in a clockwise hysteresis in the transfer characteristics of the SET 100. FIG. 9 also shows a zoomed-in region where the device 100 is turning off. Note that a $V_{GS}$ step size of 4 mV is used for this measurement. The SS is found to be 1.6 mV/decade and 6 mV/decade when averaged over 3 and 6 orders of magnitude change in the $I_{DS}$, respectively. In fact, another device demonstrates SS value <0.68 mV/decade for 7 orders of magnitude change in the $I_{DS}$, although $V_S$ is found to be ~45 V for the forward sweep and ~40 V for the reverse sweep (discussed later). The device-to-device variations seen in $V_S$ can be attributed to the variations in thickness of the exfoliated 1T' $MoTe_2$ flakes and its adhesion with Ni, and PZT substrate, as well as multi-grain nature of the PZT film, which can be mitigated through large area growth of 1T' $MoTe_2$. Nevertheless, SS values reported here are found to be among record low numbers comparable to NEMS switches and at least an order of magnitude better than TFETs, NCFETs, and PCMs and almost two orders of magnitude better than state-of-the-art silicon FinFETs.

Figure 10:
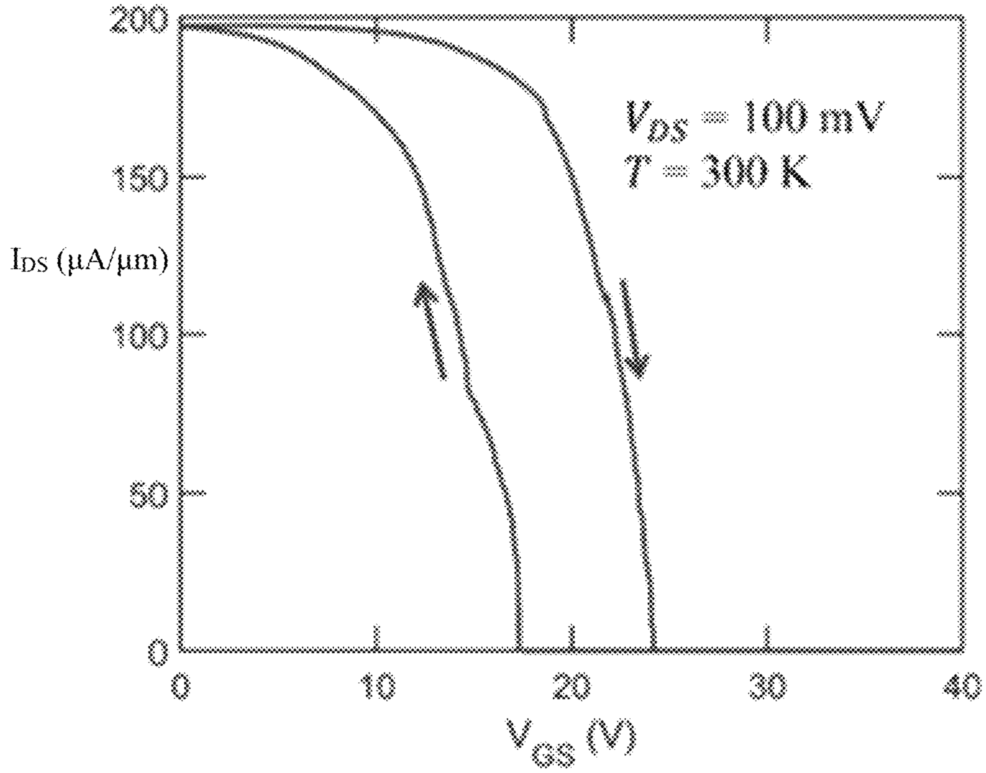
FIG. 10 shows transfer characteristics in the linear scale.
Figure 11:
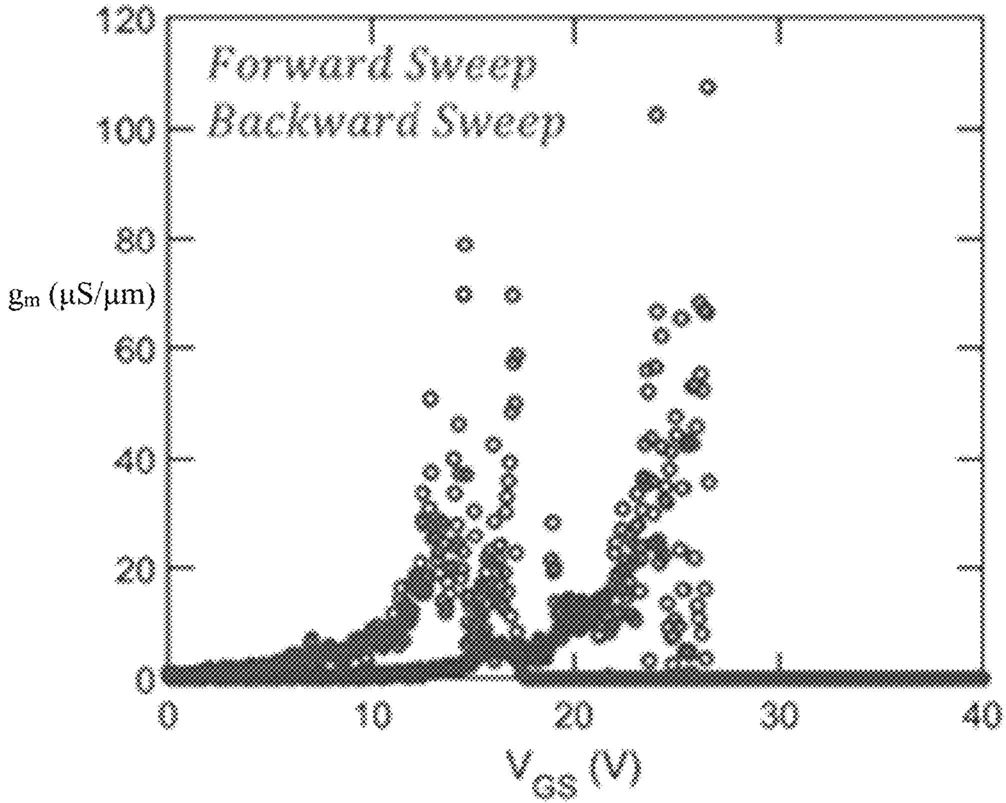
FIG. 11 shows extracted transconductance, $g_m$, versus $V_{GS}$.

FIG. 10 shows transfer characteristics in the linear scale. FIG. 11 shows extracted transconductance $g_m$, versus $V_{GS}$ for an exemplary SET 100. Peak $g_m$ is found to be >100 μS/μm for $V_{DS}$=100 mV. Note that high $g_m$ leads to high gain when a switch is used as an amplifier.

In conventional MOSFETs, the mobility of the channel material determines $g_m$. For example, record high $g_m$=3.45 mS/μm has been reported for high mobility InGaAs quantum-well MOSFET at $V_{DS}$=0.5 V. Similarly, $g_m$=282 μS/μm at $V_{DS}$=2 V was reported for high mobility black phosphorus FET. Given that $g_m$ scales linearly with $V_{DS}$, it is remarkable to find such a high $g_m$ in the inventive SET 100, which is comparable to record high values reported in the literature.

Figure 12:
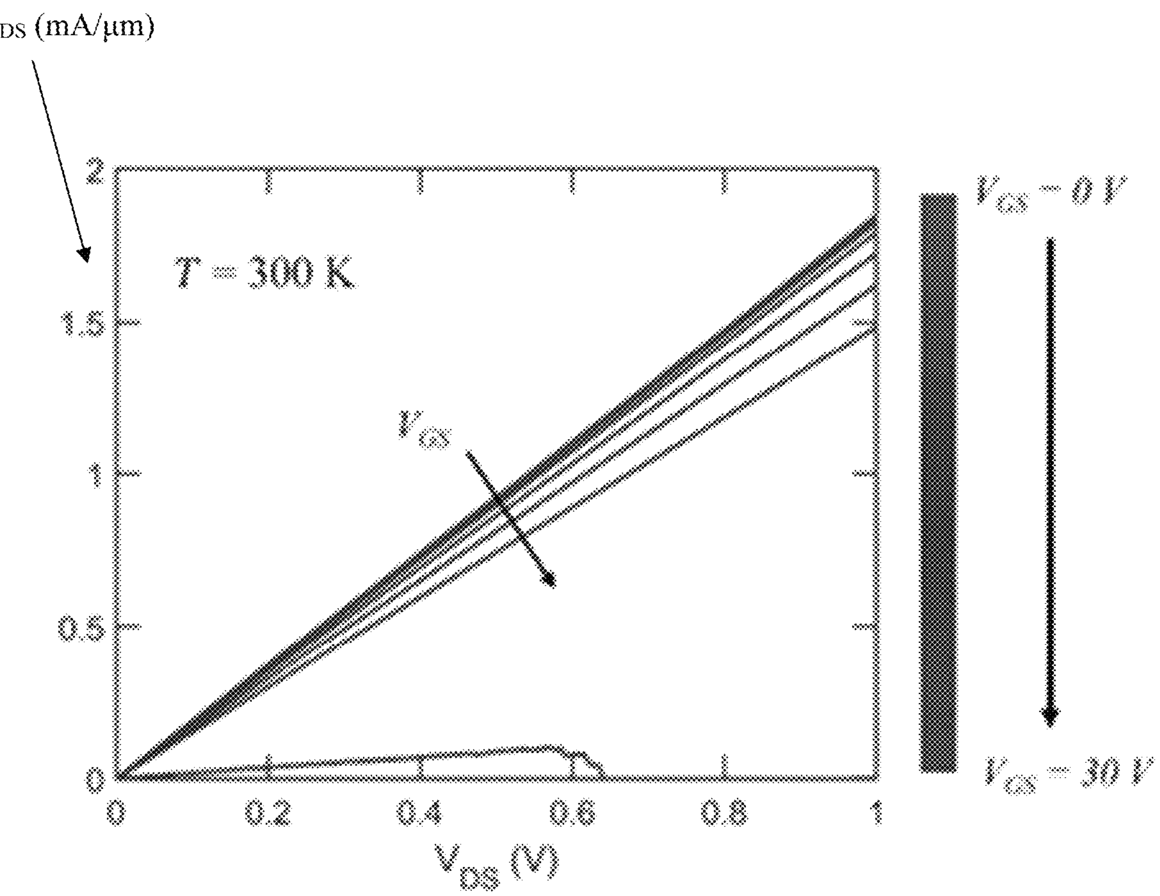
FIG. 12 shows output characteristics of an embodiment of a transistor in linear scales.
Figure 13:
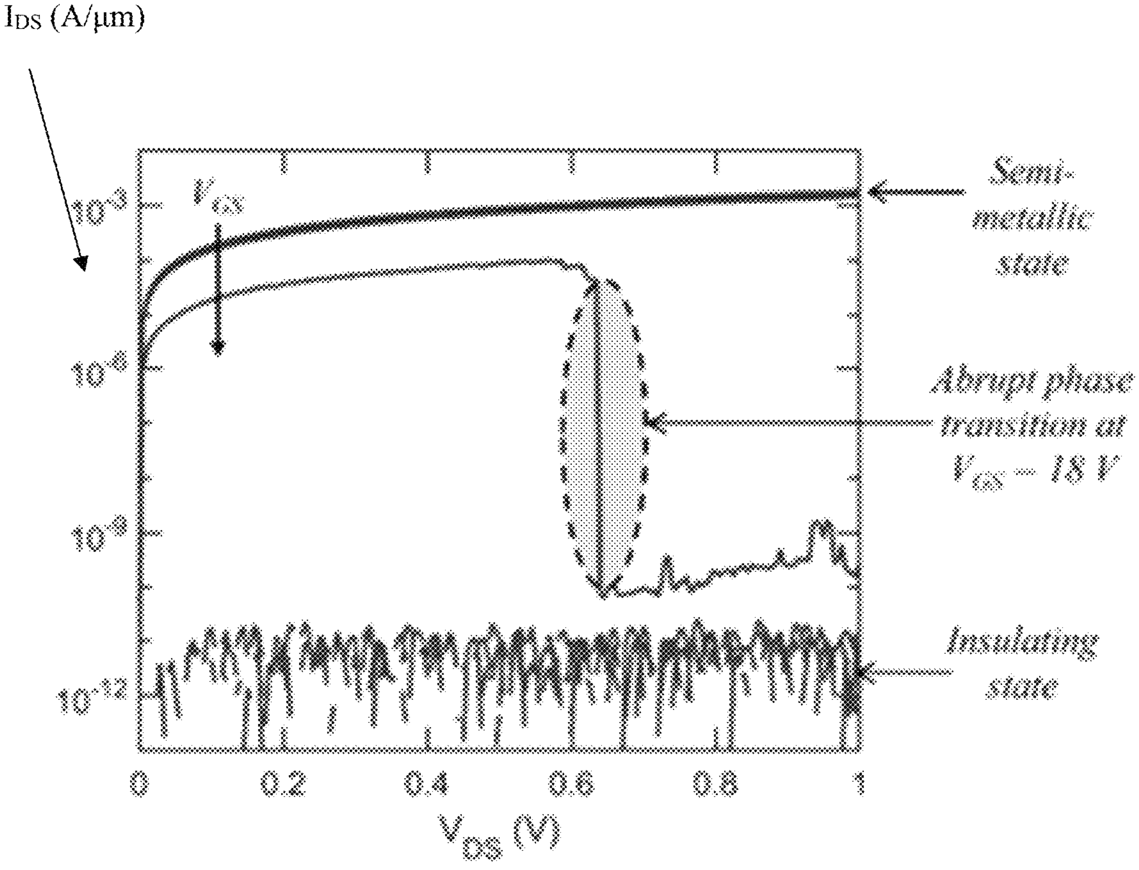
FIG. 13 shows output characteristics of an embodiment of a transistor in logarithmic scales.
Figure 14:
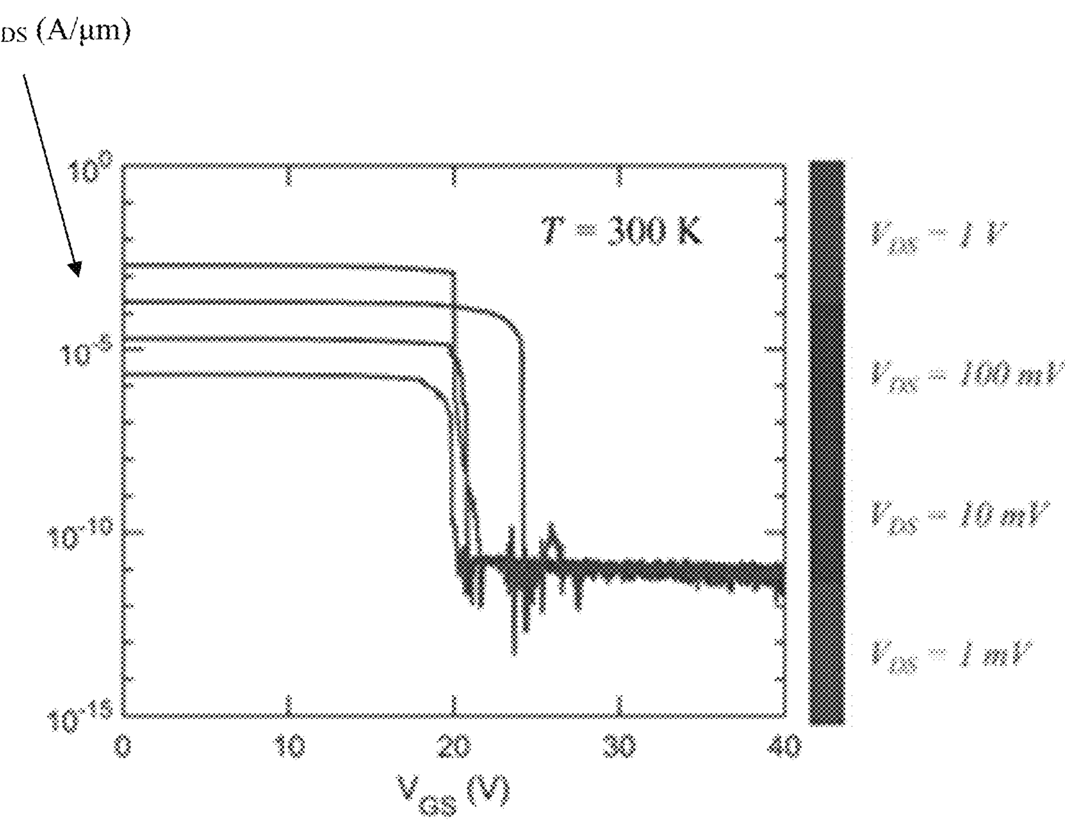
FIG. 14 shows ultra-low voltage operation of an embodiment of the transistor.

FIGS. 12-13 show the output characteristics of an exemplary SET 100, i.e. $I_{DS}$ versus $V_{DS}$ for different Vos in the linear and logarithmic scales, respectively. The color gradient runs blue to red for ascending values of $V_{GS}$. The initial state of the channel which is conducting and behaves as a resistor is evident from the linear $I_{DS}$ versus $V_{DS}$ characteristics. However, for $V_{GS}$>10 V, the slope of the line in FIG. 12 reduces, marking the beginning of the change at the interface which manifests itself as an increase in the resistance. In FIG. 13, for $V_{GS}$=18 V, there is an abrupt drop in the $I_{DS}$, which is when the interface between the 1T'-$MoTe_2$ flake and the Ni contact abruptly changes and loses electrical contact. For all subsequent (higher) values of $V_{GS}$, the SET 100 device stays in the OFF state with current levels of ~1 pA/μm. The SET 100 exhibits ON currents of ~1.8 mA/μm at $V_{DS}$=1 V, which is ~2× higher than even the most aggressively scaled silicon nano CMOS devices. This translates to an ON/OFF current ratio of $3\times10^9$. Owing to the high ON current, the SET 100 can be operated with ultra-low $V_{DS}$ values, as shown in FIG. 14. Thus, the SET 100 achieves impressive performance in four basic parameters that define an ideal transistor, i.e., high ON current, low OFF current, steep slope switching, and high transconductance.

Figure 20:
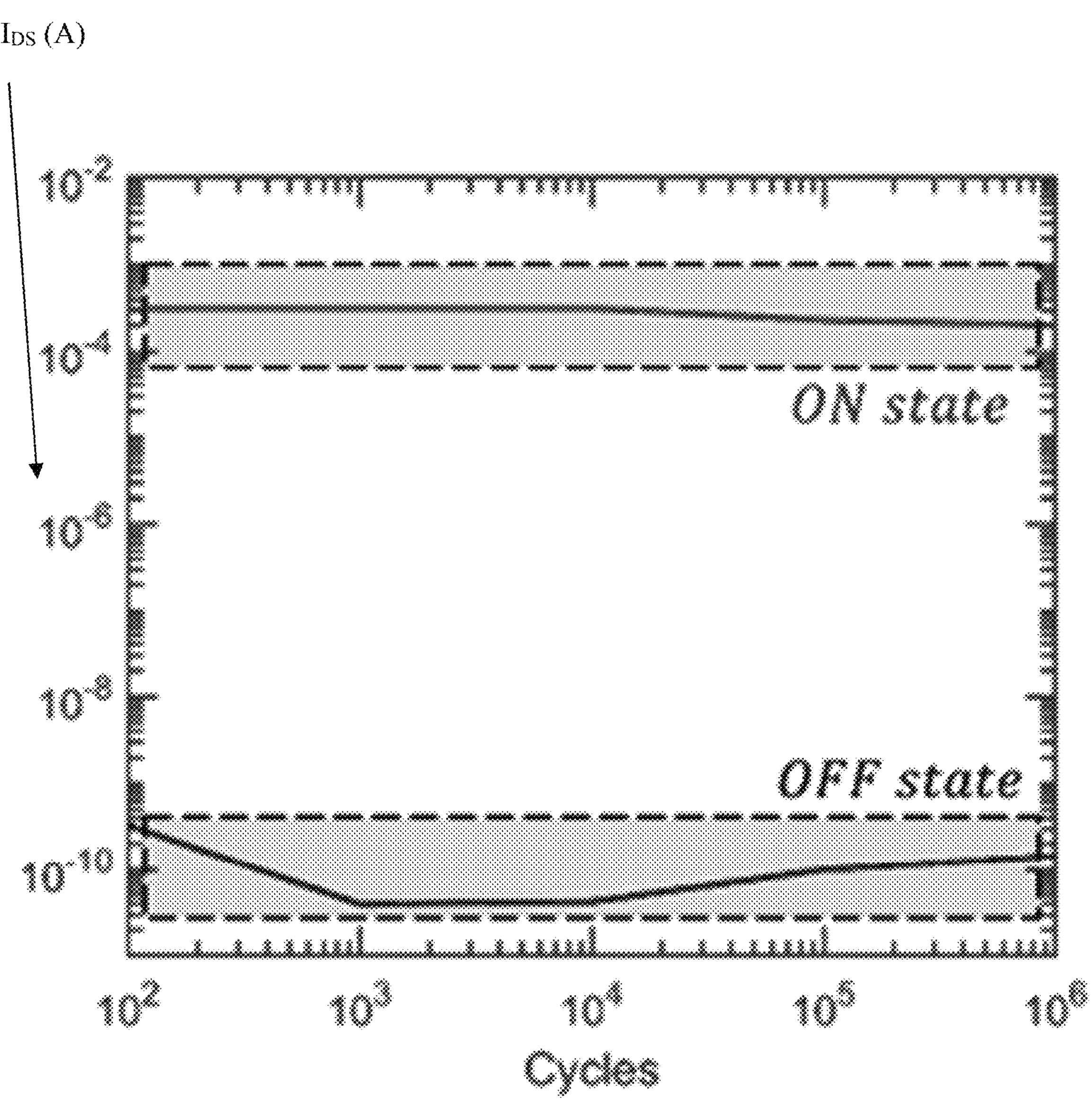
FIG. 20 shows switching endurance of an exemplary SET.
Figure 21:
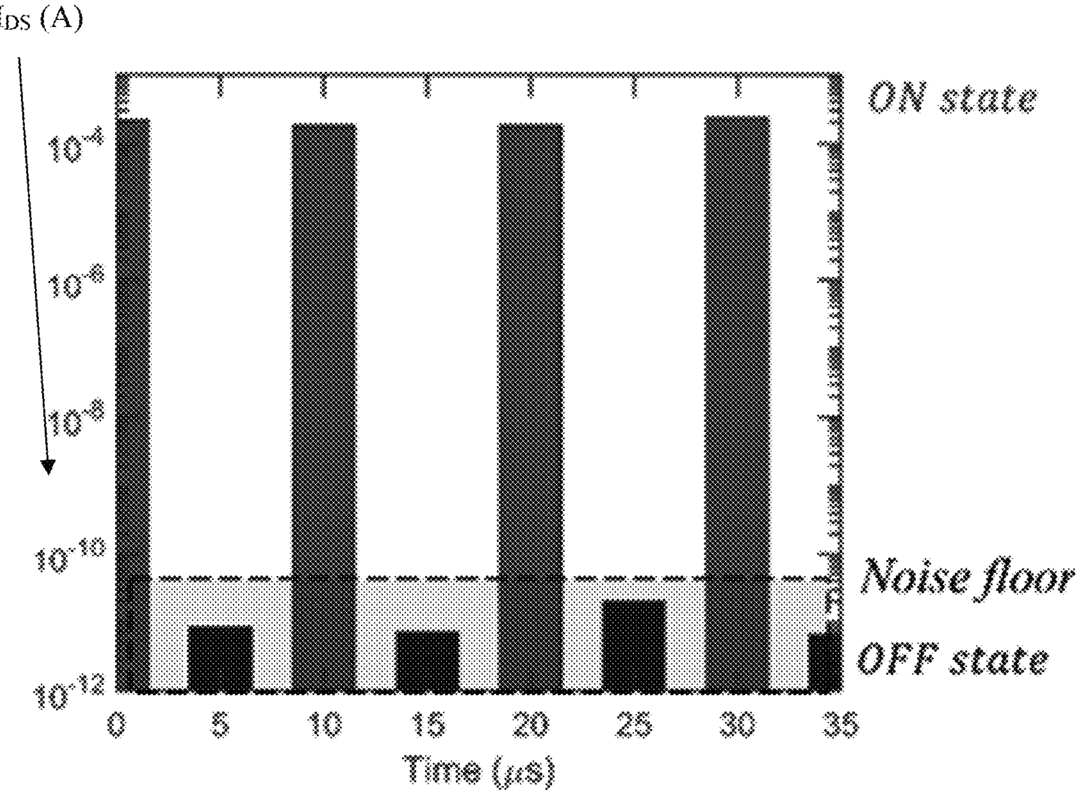
FIG. 21 shows switching delay for a post-trained or post-formed SET.

Furthermore, a training or forming process may be required for the SET 100 device to demonstrate adequate or desired steep switching. Previous work on graphene has shown that cycling the electric field across the piezoelectric layer improves the adhesion between the layers. So, for optimum strain transduction and phase transition to occur, it may be desirable for a device 100 to undergo a training process before it demonstrates an abrupt phase transition. This process involves poling the PZT by applying a high electric field across it. It is found that applying $V_G$=−60 V for 10 s produces good results for some SET 100 devices. After this, the $MoTe_2$ channel 118 is subjected to repeated transfer sweeps with $V_{GS}$=0 to 70 V and $V_{DS}$=100 mV. The evolution of the transfer characteristics during this training process is discussed later. This process is repeated until the full abrupt switching process is observed within a predetermined gate voltage range. This observation can be explained by the fact that the successive transfer sweeps stress the contact interface repeatedly until the manifestation of the effects of the contact modification appear at the interface region. This is also why the as-fabricated devices do not show any abrupt switching behavior. Once formed, the SET 100 demonstrates robust switching behavior. FIG. 20 shows the switching endurance of the SET for $10^6$ cycles. During each cycle, $V_{GS}$ is switched between 0 V and $V_S$ and $I_{DS}$ is read using $V_{DS}$=100 mV. The cycling frequency is 100 kHz. In the ON-state, $I_{DS}$=~220 μA while the OFF-state current is determined by the noise floor of our measurement setup. FIG. 21 shows switching delay for a post-trained or post-formed SET. The switching delay for the SET is found to be <5 μs as shown in FIG. 21. Note that the measurement of switching delay for the SET device is limited by the capability of the electrical instrument, which can sample low-current (~pA) only every 5 μs. Nevertheless, formed SET devices appears promising to achieve high endurance and speed.

While the working principle of the SET may appear similar to that of NEMS in some aspects, there is an important distinction. Most NEMS demonstrations in literature rely on electrostatic attraction of a suspended channel using the gate electrode to switch between the ON and the OFF states. Since the channel material must physically move across an air gap in response to an electrostatic force during the switching process, the mass of the suspended part of the channel is a limiting factor in the switching speed. However, the SET utilizes strain-induced contact modification in an abrupt yet reversible manner in a simple structure which is very similar to existing MOSFETs. Moreover, the fabrication process for NEMS devices tends to be more complex since the channel and the gate need to be at different heights with an air gap between them, which is not the case for the SET. It is challenging to observe the interface between the $MoTe_2$ channel and the Ni contact directly where the modification is supposed to occur, as it would require an in-situ material characterization experiment.

Embodiments and tests demonstrate a radically different transistor 100 by exploiting strain-induced contact modification to ultra-thin 1T'-$MoTe_2$. SS<0.68 mV/decade at room temperature has been achieved for 7 orders of magnitude change in the source-to-drain current, and a high ON current of 1.8 mA/μm, in addition to low OFF current, high ON/OFF current ratio, and high transconductance can be achieved. The SET 100 uses in-plane 130 strain from a piezoelectric layer to induce an abrupt and controlled delamination between the 1T'-$MoTe_2$ channel and the Ni the contacts 120, 122. The PZT layer used for this SET 100 device can be scaled down in thickness to achieve lower operating voltages. Likewise, the device dimensions can be scaled and yet strain induced modification should occur at the contact/channel interface. There are still some challenges such as device-to-device variations, which can be mitigated through large area growth of 1T' $MoTe_2$. Nonetheless, preliminary results are promising enough to warrant further investigation by a wider community on the SET 100, given that the SET 100 has the potential to resolve some of the most difficult and fundamental challenges facing the semiconductor industry today.

The following discussion relates to an exemplary method of making an embodiment of the transistor 100.

For fabrication of PZT film, a chemical solution deposition (CSD) method can be chosen for PZT growth. Adapted from previously established procedures, a 0.4 M $PbNb_{0.2}(Zr_{0.52}Ti_{0.48})_{0.98}O_3$ sol gel with a 10 mol % Pb excess can be prepared and deposited on platinized wafers. This composition is near the morphotropic phase boundary (MPB) and the boundary between the tetragonal and rhombohedral phases is in the $PbTiO_3/PbZrO_3$ solid solution. At this composition, the piezoelectric and dielectric properties can be significantly enhanced. A ~2 mol %, Nb dopant concentration can also improve the piezoelectric and dielectric properties. The sol-gel solution may contain Zr, Ti, Nb, and Pb organic precursors dissolved in 2-methoxyethanol (2-MOE) along with an acetylacetone chelating agent. To prepare the sol-gel solution, first, the lead acetate trihydrate can combined with 2-MOE, thoroughly dissolved at 120° C. and then dehydrated to remove any water. Next, zirconium n-propoxide, titanium iso-propoxide, and niobium ethoxide can be combined with 2-MOE under an $N_2$ atmosphere. This solution can then combined with the dried lead powder and refluxed at ~120° C. for 2 hours under flowing Ar. The solution can then distilled until the volume reaches ~90 ml. Acetylacetone chelating agent can then be added and mixed under Ar for ~30 min prior to bottling. The films can be deposited on a platinized Si wafer ($Pt(111)/TiO_2/SiO_2/Si$). An oxidized Si wafer can then be used to prevent the formation of a Pt silicide. A 30 nm Ti layer can be sputtered and then oxidized at 700° C. for 15 min in $O_2$ in a rapid thermal annealing (RTA) tool. This can set the orientation of the Pt bottom electrode sputtered at 500° C. in the (111) orientation. Next, a $PbTiO_3$ seed layer can be deposited using the same deposition procedure as the PZT layers. This (100) $PbTiO_3$ seed layer can template the PZT to orient in the (100) direction. (100) textured PZT films are reported to have improved dielectric and piezoelectric properties. The films can be grown by a layer-by-layer process. Each layer is ~80 nm and a total of 25 layers can be deposited to achieve a total thickness of 2.02±0.03 μm. The sol-gel can be first spin-coated onto the wafer at 1,500 rpm. After spinning, the edge bead can be removed using a q-tip. Next, the wafers can be dried and then pyrolyzed on a hot plate at 225° C. and 410° C. for 2 min, respectively. A RTA tool can be used to crystallize each layer at 700° C. for 60 s under flowing $O_2$. This crystallization procedure can volatilize the PbO, resulting in the formation of a Pb deficient pyrochlore phase. The PbO concentration cannot simply be increased in the sol-gel solution to address this, as an excess PbO second phase could form which can result in electrical leakage and poor reliability. Instead, after spinning layers 3, 9, 17, and 25, a 0.08 M PbO solution can be spin-coated at 6,000 rpm, dried, pyrolyzed, and crystallized with the same procedure as the PZT layers.

For fabrication of $MoTe_2$ SET 100, $MoTe_2$ flakes can be mechanically exfoliated on the PZT substrate using scotch tape. To define the source and drain contacts 120, 122, the sample can be spin coated with methyl methacrylate (MMA) followed by A3 PMMA. Then using e-beam lithography source and drain contacts 120, 122 can be patterned and developed by using 1:1 mixture of MIBK and IPA for 60 s. 40 nm of Nickel (Ni) and 30 nm of Gold (Au) can be deposited using e-beam evaporation. Finally, lift-off process can be performed to remove the evaporated Ni/Au except from the source/drain patterns by immersing the sample in acetone for 30 min followed by IPA for another 30 mins.

Electrical characterization of the fabricated SET 100 devices can be performed using Lake Shore CRX-VF probe station under high vacuum ($10^{-5}$ Torrs) condition using a Keysight B1500A parameter analyzer.

Figure 15:
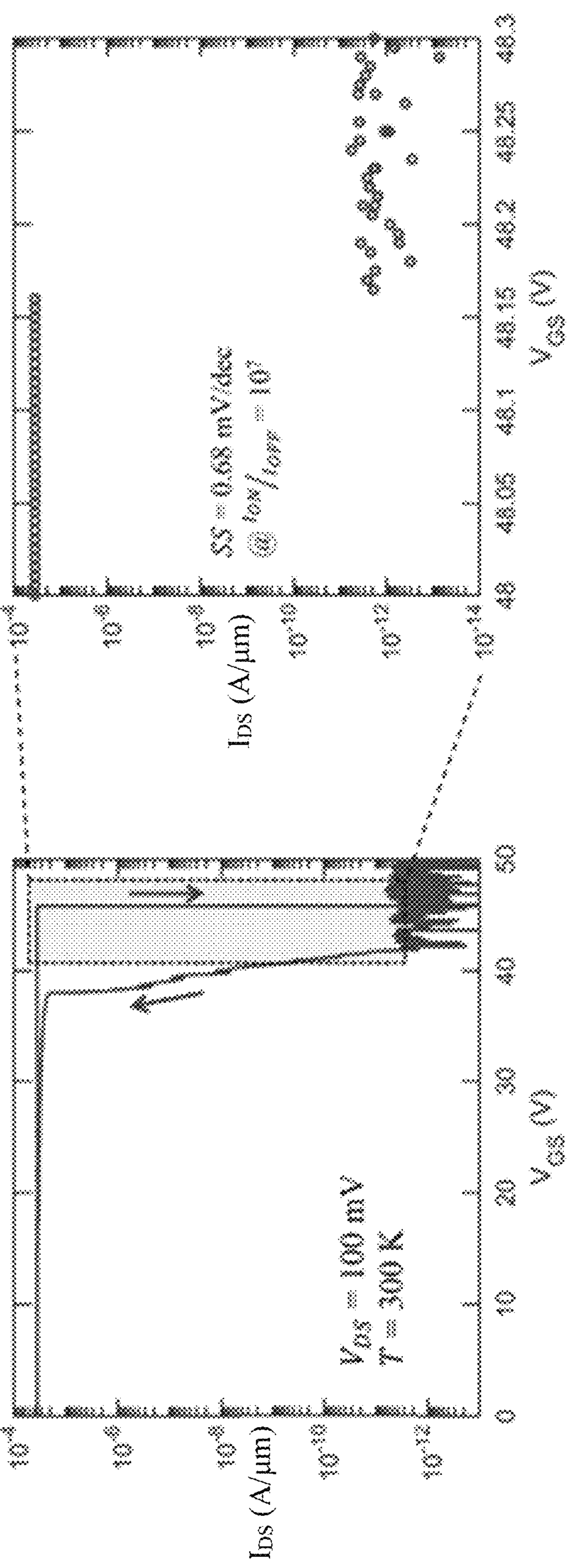
FIG. 15 shows room temperature transfer characteristics of an embodiment of the transistor with the most abrupt phase transition during the forward sweep measured using $V_{DS}$=100 mV (left) and a zoomed-in region where the device is turning off during the forward sweep.

FIG. 15 shows room temperature transfer characteristics of a champion SET 100 with the most abrupt phase transition during the forward sweep measured using $V_{DS}$=100 mV, and a zoomed-in region where the device is turning off during the forward sweep. The SS is found to be 0.68 mV/decade when averaged over 7 orders of magnitude change in the $I_{DS}$.

Figure 16:
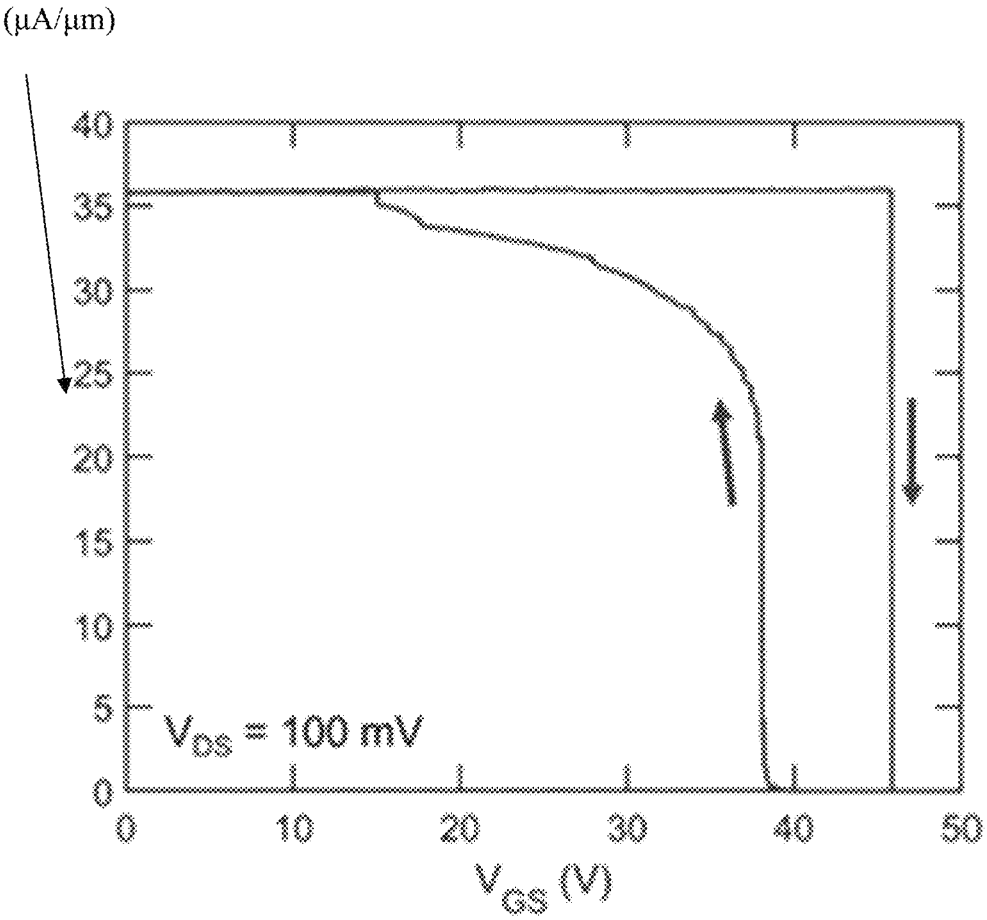
FIG. 16 shows transfer characteristics in the linear scale.
Figure 17:
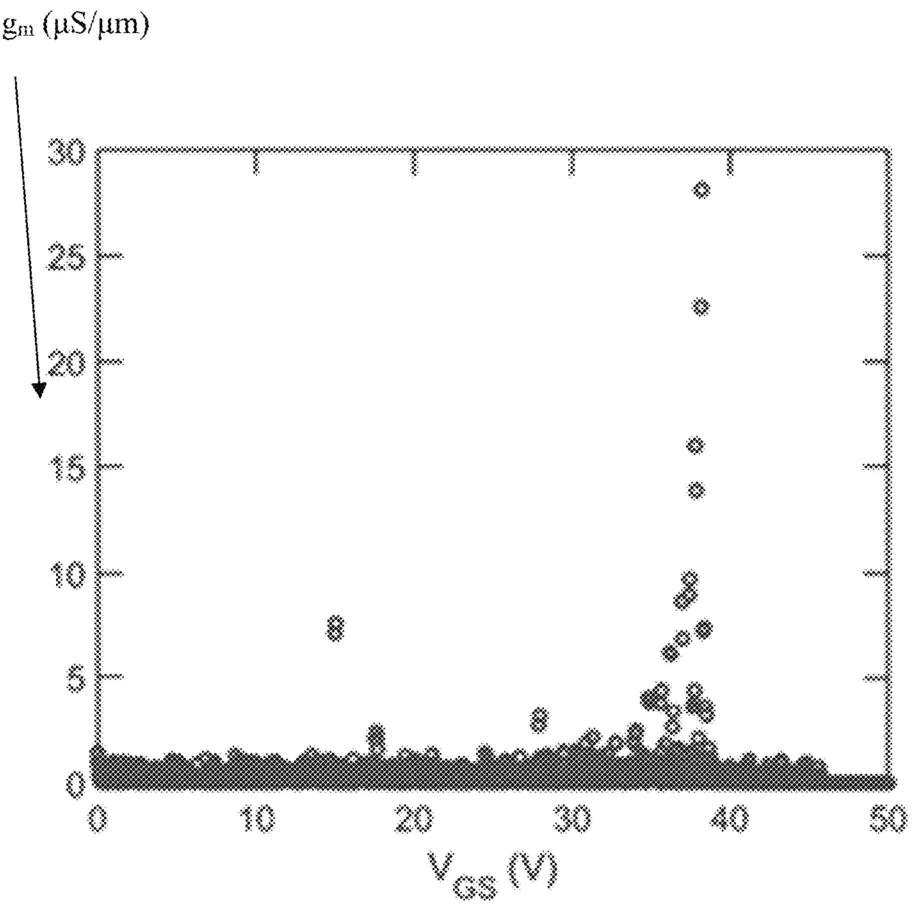
FIG. 17 shows extracted $g_m$, versus $V_{GS}$.

FIG. 16 shows transfer characteristics in the linear scale. FIG. 17 shows extracted $g_m$, versus $V_{GS}$.

Figure 18:
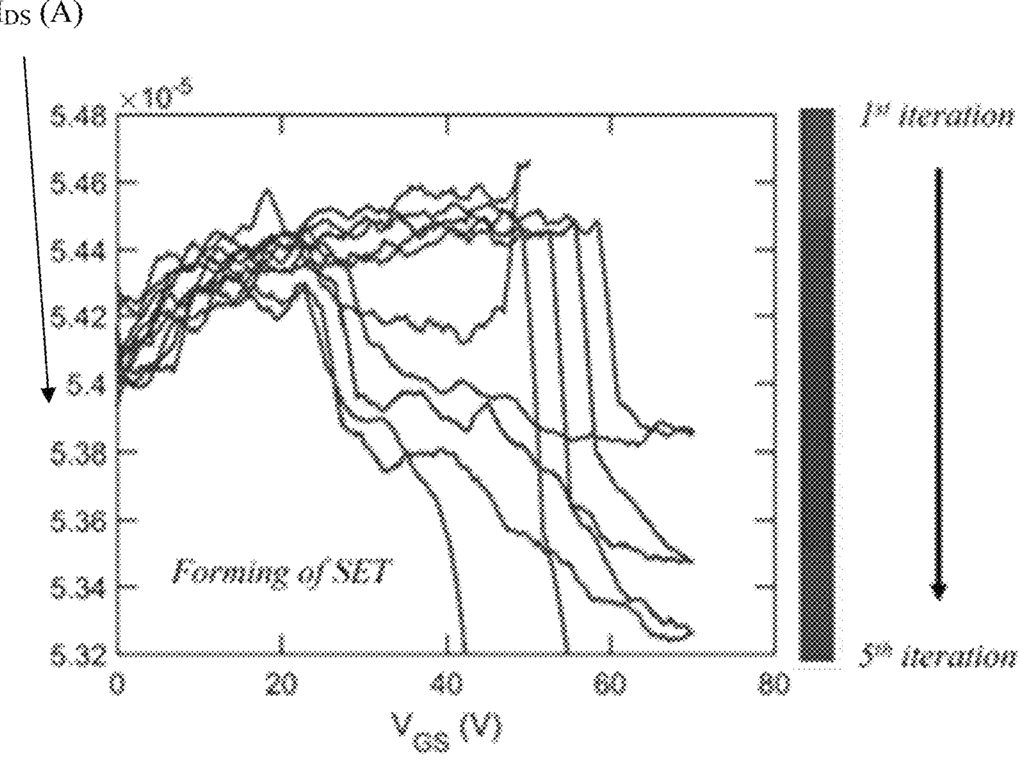
FIG. 18 shows room temperature transfer characteristics during the training or formation process for an embodiment of the transistor.
Figure 19:
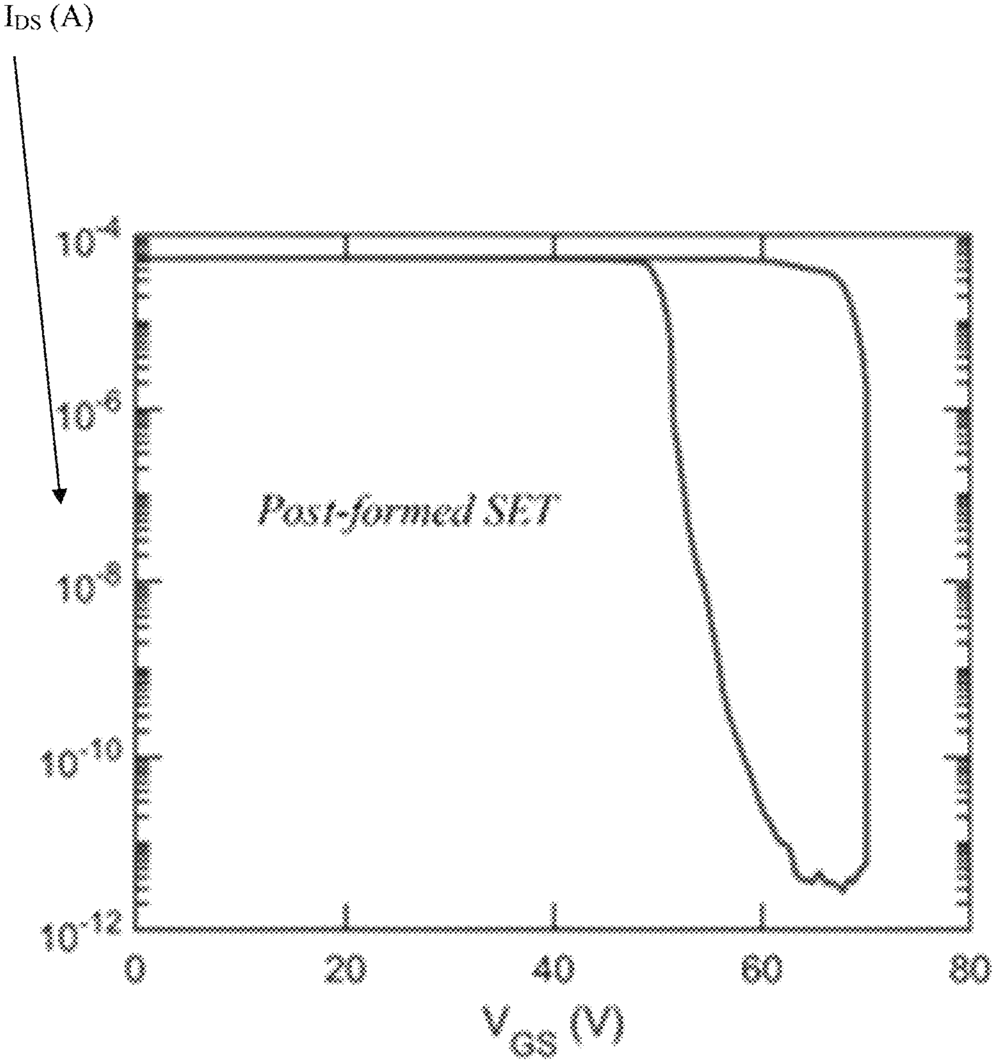
FIG. 19 shows room temperature transfer characteristics for a post-trained or post-formed embodiment of the transistor.

FIG. 18-19 show room temperature transfer characteristics (FIG. 18) during the training or formation process for an embodiment of the SET 100, and (FIG. 19) post-trained or post-formed SET 100. Each of the following references is incorporated herein by reference in its entirety.

[1] S. E. Thompson and S. Parthasarathy, "Moore's law: the future of Si microelectronics," *Materials today*, vol. 9, pp. 20-25, 2006.

[2] S. M. Sze and S. Sze, *Modern semiconductor device physics*: Wiley New York, 1998.

[3] G. J. Myers, *Advances in computer architecture*: John Wiley & Sons, Inc., 1982.

[4] X. Ma and G. R. Arce, *Computational lithography* vol. 77: John Wiley & Sons, 2011.

[5] S. Borkar, "Design challenges of technology scaling," *IEEE micro*, vol. 19, pp. 23-29, 1999.

[6] P. Lotfi-Kamran and H. Sarbazi-Azad, "Chapter One—Dark Silicon and the History of Computing," in *Advances in Computers*. vol. 110, A. R. Hurson and H. Sarbazi-Azad, Eds., ed: Elsevier, 2018, pp. 1-33.

[7] J. D. Meindl, Q. Chen, and J. A. Davis, "Limits on silicon nanoelectronics for terascale integration," *Science*, vol. 293, pp. 2044-2049, 2001.

[8] A. M. Ionescu and H. Riel, "Tunnel field-effect transistors as energy-efficient electronic switches," *Nature*, vol. 479, pp. 329-37, November 16 2011.

[9] J. Appenzeller, Y. M. Lin, J. Knoch, and P. Avouris, "Band-to-Band Tunneling in Carbon Nanotube Field-Effect Transistors," *Physical Review Letters*, vol. 93, p. 196805, Nov. 4, 2004.

[10] W. Y. Choi, B.-G. Park, J. D. Lee, and T.-J. K. Liu, "Tunneling field-effect transistors (TFETs) with subthreshold swing (SS) less than 60 mV/dec," *IEEE Electron Device Letters*, vol. 28, pp. 743-745, 2007.

[11] B. M. Borg, K. A. Dick, B. Ganjipour, M.-E. Pistol, L.-E. Wernersson, and C. Thelander, "InAs/GaSb heterostructure nanowires for tunnel field-effect transistors," *Nano letters*, vol. 10, pp. 4080-4085, 2010.

[12] B. Ganjipour, J. Wallentin, M. T. Borgstrom, L. Samuelson, and C. Thelander, "Tunnel field-effect transistors based on InP-GaAs heterostructure nanowires," *ACS nano*, vol. 6, pp. 3109-3113, 2012.

[13] D. Sarkar, X. Xie, W. Liu, W. Cao, J. Kang, Y. Gong, et al., “A subthermionic tunnel field-effect transistor with an atomically thin channel,” *Nature*, vol. 526, pp. 91-95, 2015 Oct. 1 2015.

[14] P. Wu, T. Ameen, H. Zhang, L. A. Bendersky, H. Ilatikhameneh, G. Klimeck, et al., “Complementary Black Phosphorus Tunneling Field-Effect Transistors,” *ACS Nano*, vol. 13, pp. 377-385, 2019 Jan. 22 2019.

[15] P. Wu and J. Appenzeller, “Reconfigurable Black Phosphorus Vertical Tunneling Field-Effect Transistor With Record High ON-Currents,” *IEEE Electron Device Letters*, vol. 40, pp. 981-984, 2019.

[16] S. Cristoloveanu, J. Wan, and A. Zaslavsky, “A review of sharp-switching devices for ultra-low power applications,” *IEEE Journal of the Electron Devices Society*, vol. 4, pp. 215-226, 2016.

[17] S. Salahuddin and S. Datta, “Use of Negative Capacitance to Provide Voltage Amplification for Low Power Nanoscale Devices,” *Nano Letters*, vol. 8, pp. 405-410, 2008 Feb. 1 2008.

[18] E. Ko, J. W. Lee, and C. Shin, “Negative Capacitance FinFET With Sub-20-mV/decade Subthreshold Slope and Minimal Hysteresis of 0.48 V,” *IEEE Electron Device Letters*, vol. 38, pp. 418-421, 2017.

[19] M. H. Lee, S. T. Fan, C. H. Tang, P. G. Chen, Y. C. Chou, H. H. Chen, et al., “Physical thickness 1·x nm ferroelectric HfZrOx negative capacitance FETs,” in 2016 *IEEE International Electron Devices Meeting* (*IEDM*), 2016, pp. 12.1.1-12.1.4.

[20] S. S. Cheema, D. Kwon, N. Shanker, R. Dos Reis, S.-L. Hsu, J. Xiao, et al., “Enhanced ferroelectricity in ultrathin films grown directly on silicon,” *Nature*, vol. 580, pp. 478-482, 2020.

[21] M. Si, C. Jiang, C. Su, Y. Tang, L. Yang, W. Chung, et al., “Sub-60 mV/dec ferroelectric HZO MoS<inf>2</inf> negative capacitance field-effect transistor with internal metal gate: The role of parasitic capacitance,” in 2017 *IEEE International Electron Devices Meeting* (*IEDM*), 2017, pp. 23.5.1-23.5.4.

[22] M. A. Alam, M. Si, and P. D. Ye, “A critical review of recent progress on negative capacitance field-effect transistors,” ed: AIP Publishing LLC, 2019.

[23] W. Cao and K. Banerjee, “Is negative capacitance FET a steep-slope logic switch?,” *Nature Communications*, vol. 11, p. 196, 2020 Jan. 10 2020.

[24] K. D. Shukla, N. Saxena, S. Durai, and A. Manivannan, “Redefining the Speed Limit of Phase Change Memory Revealed by Time-resolved Steep Threshold-Switching Dynamics of AgInSbTe Devices,” *Scientific Reports*, vol. 6, p. 37868, 2016 Nov. 25 2016.

[25] N. Shukla, B. Grisafe, R. K. Ghosh, N. Jao, A. Aziz, J. Frougier, et al., “Ag/HfO<inf>2</inf> based threshold switch with extreme non-linearity for unipolar cross-point memory and steep-slope phase-FETs,” in 2016 *IEEE International Electron Devices Meeting* (*IEDM*), 2016, pp. 34.6.1-34.6.4.

[26] W. A. Vitale, E. A. Casu, A. Biswas, T. Rosca, C. Alper, A. Krammer, et al., “A Steep-Slope Transistor Combining Phase-Change and Band-to-Band-Tunneling to Achieve a sub-Unity Body Factor,” *Scientific Reports*, vol. 7, p. 355, 2017 Mar. 23 2017.

[27] M. Riverola, A. Uranga, F. Torres, and N. Barniol, “Fabrication and characterization of a hammer-shaped CMOS/BEOL-embedded nanoelectromechanical (NEM) relay,” *Microelectronic Engineering*, vol. 192, pp. 44-51, 2018.

[28] IEEE. *International Roadmap for Devices and Systems* (IRDS™) (2020 ed.). Available: https://irds.ieee.org/editions/2020

[29] Z. Liu, J. Liu, M. D. Biegalski, J.-M. Hu, S. Shang, Y. Ji, et al., “Electrically reversible cracks in an intermetallic film controlled by an electric field,” *Nature communications*, vol. 9, pp. 1-7, 2018.

[30] X. Zhang, Z. Jin, L. Wang, J. A. Hachtel, E. Villarreal, Z. Wang, et al., “Low contact barrier in 2H/1T'MoTe2 in-plane heterostructure synthesized by chemical vapor deposition,” *ACS applied materials & interfaces*, vol. 11, pp. 12777-12785, 2019.

[31] F. K. Lotgering, “Topotactical reactions with ferrimagnetic oxides having hexagonal crystal structures—I,” *Journal of Inorganic and Nuclear Chemistry*, vol. 9, pp. 113-123, 1959 Feb. 1, 1959.

[32] I. H. Kazi, P. Wild, T. Moore, and M. Sayer, “Characterization of sputtered nichrome (Ni-Cr 80/20 wt. %) films for strain gauge applications,” *Thin Solid Films*, vol. 515, pp. 2602-2606, 2006.

[33] R. Gandhi, Z. Chen, N. Singh, K. Banerjee, and S. Lee, “Vertical Si-Nanowire<formula formulatype=“inline”><tex Notation=“TeX”>$n$</tex></formula>-Type Tunneling FETs With Low Subthreshold Swing (<formula formulatype=“inline”><tex Notation=“TeX”>$\leq \hbox {50}\\hbox{mV/decade}$</tex> </formula>) at Room Temperature,” *IEEE Electron Device Letters*, vol. 32, pp. 437-439, 2011.

[34] T. Krishnamohan, D. Kim, S. Raghunathan, and K. Saraswat, “Double-Gate Strained-Ge Heterostructure Tunneling FET (TFET) With record high drive currents and <<60 mV/dec subthreshold slope,” in 2008 *IEEE International Electron Devices Meeting,* 2008, pp. 1-3.

[35] H. W. Then, S. Dasgupta, M. Radosavljevic, L. Chow, B. Chu-Kung, G. Dewey, et al., “Experimental observation and physics of “negative” capacitance and steeper than 40 mV/decade subthreshold swing in A1<inf>0.83</inf>In<inf>0.17</inf>N/A1N/GaN MOS-HEMT on SiC substrate,” in 2013 *IEEE International Electron Devices Meeting,* 2013, pp. 28.3.1-28.3.4.

[36] V. Subramanian, B. Parvais, J. Borremans, A. Mercha, D. Linten, P. Wambacq, et al., “Planar Bulk MOSFET<emphasis emphasistype=“smcaps”></emphasis> Versus FinFETs: An Analog/RF Perspective,” *IEEE Transactions on Electron Devices*, vol. 53, pp. 3071-3079, 2006.

[37] C. Hu, “3D FinFET and other sub-22 nm transistors,” in 2012 19*th IEEE International Symposium on the Physical and Failure Analysis of Integrated Circuits,* 2012, pp. 1-5.

[38] J. Lin, X. Cai, Y. Wu, D. A. Antoniadis, and J. A. del Alamo, “Record Maximum Transconductance of 3.45 mS/$\mu\text {m} $ for III-V FETs,” *IEEE Electron Device Letters*, vol. 37, pp. 381-384, 2016.

[39] N. Haratipour and S. J. Koester, “Ambipolar black phosphorus MOSFETs with record n-channel transconductance,” *IEEE Electron Device Letters*, vol. 37, pp. 103-106, 2015.

[40] L. Chang, C. Yang-kyu, D. Ha, P. Ranade, X. Shiying, J. Bokor, et al., “Extremely scaled silicon nano-CMOS devices,” *Proceedings of the IEEE*, vol. 91, pp. 1860-1873, 2003.

[41] W. Hou, A. Azizimanesh, A. Sewaket, T. Peña, C. Watson, M. Liu, et al., “Strain-based room-temperature non-volatile MoTe 2 ferroelectric phase change transistor,” *Nature nanotechnology*, vol. 14, pp. 668-673, 2019.

[42] S. Das and J. Appenzeller, "WSe2 field effect transistors with enhanced ambipolar characteristics," *Applied physics letters*, vol. 103, p. 103501, 2013.

[43] J.-H. Kim, Z. C. Y. Chen, S. Kwon, and J. Xiang, "Three-Terminal Nanoelectromechanical Field Effect Transistor with Abrupt Subthreshold Slope," *Nano Letters*, vol. 14, pp. 1687-1691, 2014 Mar. 12 2014.

[44] N. H. Van, M. Muruganathan, J. Kulothungan, and H. Mizuta, "Fabrication of a three-terminal graphene nanoelectromechanical switch using two-dimensional materials," *Nanoscale*, vol. 10, pp. 12349-12355, 2018.

[45] X. Feng, M. Matheny, C. A. Zorman, M. Mehregany, and M. Roukes, "Low voltage nanoelectromechanical switches based on silicon carbide nanowires," *Nano letters*, vol. 10, pp. 2891-2896, 2010.

[46] R. W. Schwartz, "Chemical Solution Deposition of Perovskite Thin Films," *Chemistry of Materials*, vol. 9, pp. 2325-2340, 1997 Nov. 1 1997.

[47] K. D. Budd, S. K. Dey, and D. A. Payne, "SOL-GEL PROCESSING OF PbTIO/3, PbZrO/3, PZT, AND PLZT THIN FILMS," in *British Ceramic Proceedings,* 1985, pp. 107-121.

[48] R. A. Wolf and S. Trolier-Mckinstry, "Temperature dependence of the piezoelectric response in lead zirconate titanate films," *Journal of Applied Physics*, vol. 95, pp. 1397-1406, 2004 Feb. 1 2004.

[49] V. Kayasu and M. Ozenbas, "The effect of Nb doping on dielectric and ferroelectric properties of PZT thin films prepared by solution deposition," *Journal of the European Ceramic Society*, vol. 29, pp. 1157-1163, 2009 Apr. 1, 2009.

[50] N. Ledermann, P. Muralt, J. Baborowski, S. Gentil, K. Mukati, M. Cantoni, et al., "{1 0 0}-Textured, piezoelectric Pb(Zrx, Ti1-x)O3 thin films for MEMS: integration, deposition and properties," *Sensors and Actuators A: Physical*, vol. 105, pp. 162-170, 2003 Jul. 15, 2003.

[51] S. Hiboux and P. Muralt, "Piezoelectric and dielectric properties of sputter deposited (111), (100) and random-textured Pb(ZrxTi1-x)O3 (PZT) thin films," *Ferroelectrics*, vol. 224, pp. 315-322, 1999 Mar. 1, 1999.

[52] V. S. Tiwari, A. Kumar, V. K. Wadhawan, and D. Pandey, "Kinetics of formation of the pyrochlore and perovskite phases in sol-gel derived lead zirconate titanate powder," *Journal of Materials Research*, vol. 13, pp. 2170-2173, 1998.

[53] D. M. Marincel, S. Jesse, A. Belianinov, M. B. Okatan, S. V. Kalinin, T. N. Jackson, et al., "A-site stoichiometry and piezoelectric response in thin film PbZr1-xTixO3," *Journal of Applied Physics*, vol. 117, p. 204104, 2015 May 28, 2015.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

It should be understood that modifications to the embodiments disclosed herein can be made to meet a particular set of design criteria. Therefore, while certain exemplary embodiments of the apparatus and methods of using and making the same disclosed herein have been discussed and illustrated, it is to be distinctly understood that the invention is not limited thereto but may be otherwise variously embodied and practiced within the scope of the following claims.

What is claimed is:

1. A transistor, comprising:

a substrate;

a gate formed in or on a surface of the substrate, the gate comprising a piezoelectric material;

a drain and a source, each of the drain and the source formed in or on a surface of the gate;

a channel formed in or on a surface of the gate, the channel located between the drain and the source, the channel comprising a semiconducting/semi-metallic material;

a source contact region comprising a transistor layer stack in which a source contact is vertically aligned with the source, the channel, and the gate, the source contact being formed at the source and configured to anchor the semiconducting/semi-metallic material to the piezoelectric material via mechanical or chemical adhesion between the semiconducting/semi-metallic material and the piezoelectric material;

a drain contact region comprising a transistor layer stack in which a drain contact is vertically aligned with the drain, the channel, and the gate, the drain contact being formed at the drain and configured to anchor the semiconducting/semi-metallic material to the piezoelectric material via mechanical or chemical adhesion between the semiconducting/semi-metallic material and the piezoelectric material;

wherein strain induced transduction in the gate causes contact modification between the channel and the source contact and between the channel and the drain contact;

wherein such that strain transduction is limited to the channel material within the source contact region and the drain contact region due to: the anchoring by the source contact and drain contact; and tensile strength of the source contact material and the drain contact material.

2. The transistor of claim 1, wherein:

an out-of-plane direction is defined by a vertical direction through the substrate, the gate, and the channel;

an in-plane direction is defined as a horizontal direction perpendicular to the out-of-plane direction; and an electric field applied to the gate generates an out-of-plane strain on the piezoelectric material which causes the contact modification.

3. The transistor of claim 1, wherein the contact modification involves cracking/delamination at the interface between the channel and the source contact material and/or the drain contact material or a conductor to insulator phase transition at the interface between the channel and the source contact material and/or the drain contact material.

4. The transistor of claim 2, wherein:

the substrate forms a second gate and the second gate is connected to a gate-to-source voltage ($V_{GS}$);

the drain is connected to a drain-to-source voltage ($V_{DS}$);

the source is connected to ground; and $V_{GS}>0$ applies an electric field to the gate.

5. The transistor of claim 2, wherein an electric field greater than a threshold value is required to generate contact modification.

6. The transistor of claim 5, wherein Vas greater than or equal to a threshold value ($V_{GS}$> or $=V_S$) generates the electric field greater than the threshold value to cause the contact modification.

7. The transistor of claim 6, wherein:

when $V_{GS}<V_S$, the transistor is in an ON state; and when $V_{GS}$> or $=V_S$, the transistor is in an OFF state.

8. The transistor of claim 1, wherein the substrate is a conducting material or a degenerately doped semiconducting material.

9. The transistor of claim 1, wherein the piezoelectric material is lead zirconate titanate (PZT).

10. The transistor of claim 1, wherein the piezoelectric material has a thickness of 2 micrometers (μm).

11. The transistor of claim 1, wherein the channel material is a voltage induced strain transduction material.

12. The transistor of claim 1, wherein the channel material is a semiconducting/semi-metallic material.

13. The transistor of claim 1, wherein the transistor exhibits contact modification at room temperature.

14. The transistor of claim 1, wherein the channel comprises IT' $MoTe_2$ or graphene.

* * * * *